(12) United States Patent
Wu et al.

(10) Patent No.: US 11,251,280 B2
(45) Date of Patent: Feb. 15, 2022

(54) STRAINED NANOWIRE TRANSISTOR WITH EMBEDDED EPI

(71) Applicant: INTERNATIONAL BUSINESS MACHINES CORPORATION, Armonk, NY (US)

(72) Inventors: Heng Wu, Guilderland, NY (US); Chen Zhang, Albany, NY (US); Kangguo Cheng, Schenectady, NY (US); Xin Miao, Slingerlands, NY (US); Lan Yu, Voorheesville, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 16/717,204

(22) Filed: Dec. 17, 2019

(65) Prior Publication Data

US 2021/0184002 A1    Jun. 17, 2021

(51) Int. Cl.
*H01L 29/423* (2006.01)
*H01L 29/06* (2006.01)
*H01L 29/78* (2006.01)
*H01L 29/786* (2006.01)
*H01L 29/66* (2006.01)
*H01L 21/02* (2006.01)

(52) U.S. Cl.
CPC .. *H01L 29/42392* (2013.01); *H01L 21/02532* (2013.01); *H01L 29/0673* (2013.01); *H01L 29/66795* (2013.01); *H01L 29/7856* (2013.01); *H01L 29/78696* (2013.01)

(58) Field of Classification Search
CPC ......... H01L 21/02518; H01L 21/02521; H01L 21/02532; H01L 21/0259; H01L 21/02603; H01L 21/0262; H01L 21/225; H01L 21/2251; H01L 21/324; H01L 21/823412; H01L 21/823431; H01L 21/8238; H01L 21/823807; H01L 21/823821; H01L 29/02; H01L 29/0657; H01L 29/0665; H01L 29/0669; H01L 29/0673; H01L 29/165; H01L 29/167; H01L 29/36; H01L 29/40; H01L 29/42312; H01L 29/4232; H01L 29/42392; H01L 29/66795; H01L 29/785; H01L 29/7856; H01L 29/8696
See application file for complete search history.

(56) References Cited

U.S. PATENT DOCUMENTS

| | | | |
|---|---|---|---|
| 8,921,825 B2 | 12/2014 | Bangsaruntip | |
| 9,437,502 B1 | 9/2016 | Cheng | |
| 9,799,748 B1 * | 10/2017 | Xie | ............ H01L 29/66439 |
| 9,825,143 B1 | 11/2017 | Leobandung | |

(Continued)

*Primary Examiner* — Cheung Lee
(74) *Attorney, Agent, or Firm* — L. Jeffrey Kelly

(57) ABSTRACT

Forming a fin, where the fin includes a nanowire stack on a semiconductor substrate, where the nanowire stack includes a plurality of silicon layers and a plurality of silicon germanium layers stacked one on top of the other in an alternating fashion, removing a portion of the fin to form an opening and expose vertical sidewalls of the plurality of silicon layers and the plurality of silicon germanium layer, and epitaxially growing a source drain region/structure in the opening from the exposed vertical sidewalls of the plurality of silicon layers and the plurality of silicon germanium layers, where the source drain region/structure substantially fills the opening.

16 Claims, 25 Drawing Sheets

(56) References Cited

U.S. PATENT DOCUMENTS

| | | |
|---|---|---|
| 9,935,205 B2 | 4/2018 | Kim |
| 9,941,405 B2 | 4/2018 | Kittl |
| 9,947,804 B1 | 4/2018 | Frougier |
| 10,008,583 B1 | 6/2018 | Rodder |
| 10,163,729 B2 | 12/2018 | Ching |
| 10,170,550 B2 | 1/2019 | Frank |
| 10,170,634 B2 * | 1/2019 | Chang |
| 2012/0138886 A1 * | 6/2012 | Kuhn ............... H01L 29/785 257/9 |
| 2017/0345945 A1 | 11/2017 | Lee |
| 2018/0006139 A1 * | 1/2018 | Seo ............... H01L 29/66795 |
| 2018/0061944 A1 * | 3/2018 | Cheng ............. H01L 29/1033 |
| 2018/0090582 A1 | 3/2018 | Adusumilli |
| 2020/0127119 A1 * | 4/2020 | Lin ............... H01L 29/42392 |

\* cited by examiner

Section A-A

Section B-B

Section A-A

Section B-B

Section A-A

Section B-B

Section A-A

Section B-B

Section A-A

Section B-B

Section A-A

Section B-B

Section A-A

Section B-B

Section A-A

Section B-B

STRAINED NANOWIRE TRANSISTOR WITH EMBEDDED EPI

BACKGROUND

The present invention relates, generally, to the field of semiconductor manufacturing, and more particularly to fabricating field effect transistors.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of stacked nanosheets extending between a pair of source drain epitaxial regions. Each nanosheet is a channel and may be referred to as a nanowire. A gate all around nanowire or nanosheet refers to a gate which surrounds all four vertical surfaces of the nanosheet FET.

Growing the source drain epitaxial region with a larger lattice constraint introduces stress in the channel which boosts transistor performance, allowing for a relatively higher circuit speed and higher current. Growing the source drain epitaxial region with a larger lattice constraint is desired for improved transistor performance.

SUMMARY

According to an embodiment, a method for forming a semiconductor structure is provided. The method including forming a fin, where the fin includes a nanowire stack on a semiconductor substrate, where the nanowire stack includes a plurality of silicon layers and a plurality of silicon germanium layers stacked one on top of the other in an alternating fashion, removing a portion of the fin to form an opening and expose vertical sidewalls of the plurality of silicon layers and the plurality of silicon germanium layer, and epitaxially growing a source drain region/structure in the opening from the exposed vertical sidewalls of the plurality of silicon layers and the plurality of silicon germanium layers, where the source drain region/structure substantially fills the opening.

According to an embodiment, a method for forming a semiconductor structure is provided. The method including forming an opening in a stacked nanowire fin formed on a substrate, where the stacked nanosheet fin includes alternating layers of silicon germanium and silicon stacked one on top of the other, growing an epitaxy in the opening, wherein a vertical side surface of the epitaxy is coplanar with each of the silicon germanium layers and each of the silicon layers.

According to an embodiment, a semiconductor structure is provided. The semiconductor structure including a stacked nanowire fin stack above a substrate on a semiconductor substrate, where the stacked nanowire fin includes alternating layers of high k spacer and silicon stacked one on top of the other, and an epitaxial source drain region adjacent to and directly contacting sidewalls of the stacked nanowire fin stack in an opening along the stacked nanosheet fin, where a vertical side surface of the epitaxy is coplanar with a sidewall of the stacked nanowire fin stack, wherein the epitaxial source drain region entirely fills the opening.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
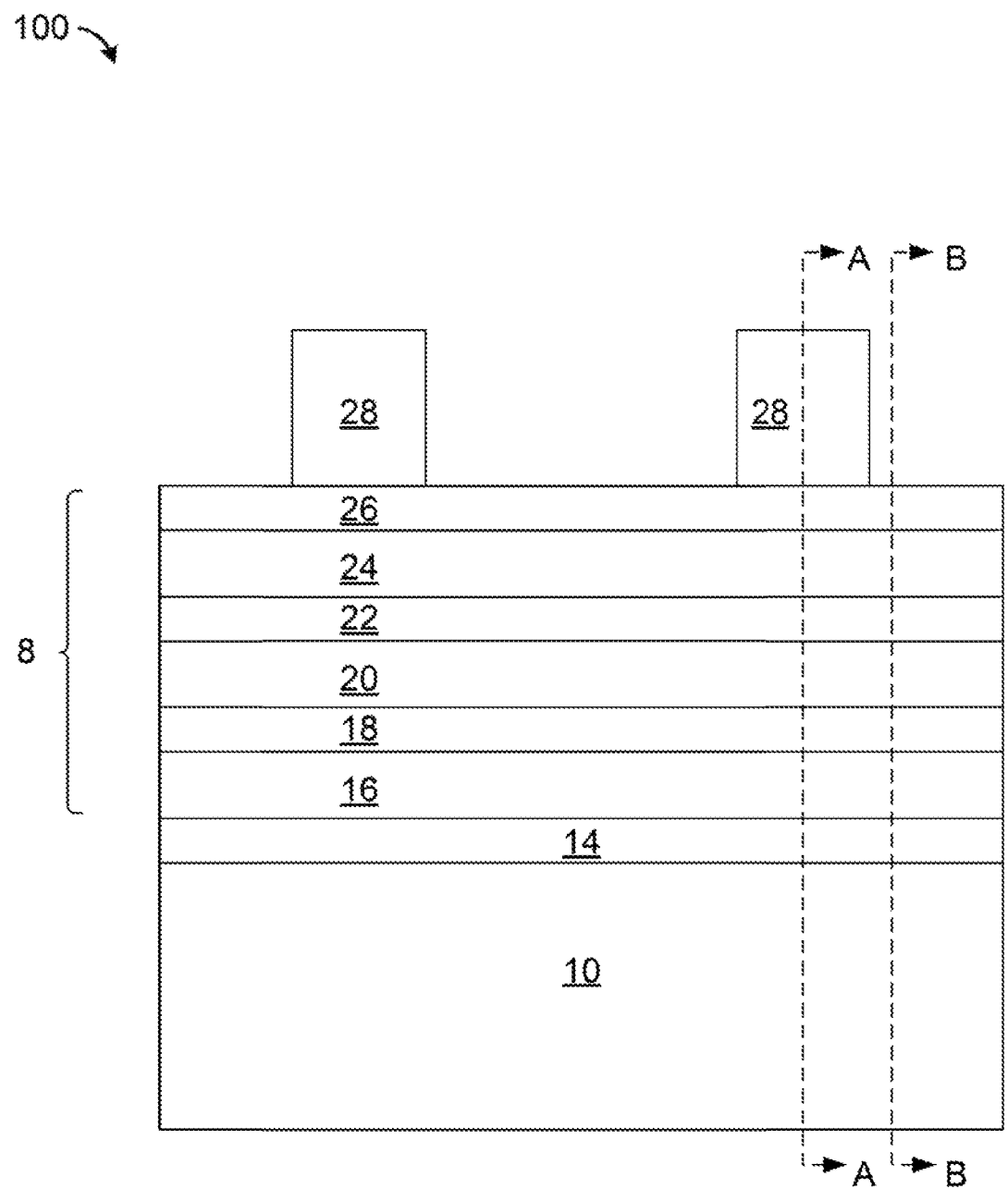
FIG. 1 illustrates a cross-sectional view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet FET includes a plurality of stacked nanosheets, with alternate layers of silicon and silicon germanium. Traditionally, formation of gate all around stacked nanosheet transistors includes growing source drain epitaxy from exposed vertical edges of silicon layers of the stacked nanosheet, which is difficult to grow due to the small exposed silicon area and high requirements for a clean surface to grow the epitaxy. The silicon germanium layers traditionally have a spacer surrounding vertical edges, preventing epitaxial growth from the silicon germanium layers.

The present invention generally relates to semiconductor manufacturing and more particularly to growing source drain epitaxy from exposed vertical edges of both the silicon layer and the silicon germanium layers of the stacked nanosheet.

A method of growing source drain epitaxy for a gate all around nanowire transistor is described in detail below by referring to the accompanying drawings in FIGS. 1-25, in accordance with an illustrative embodiment.

Figure 2:
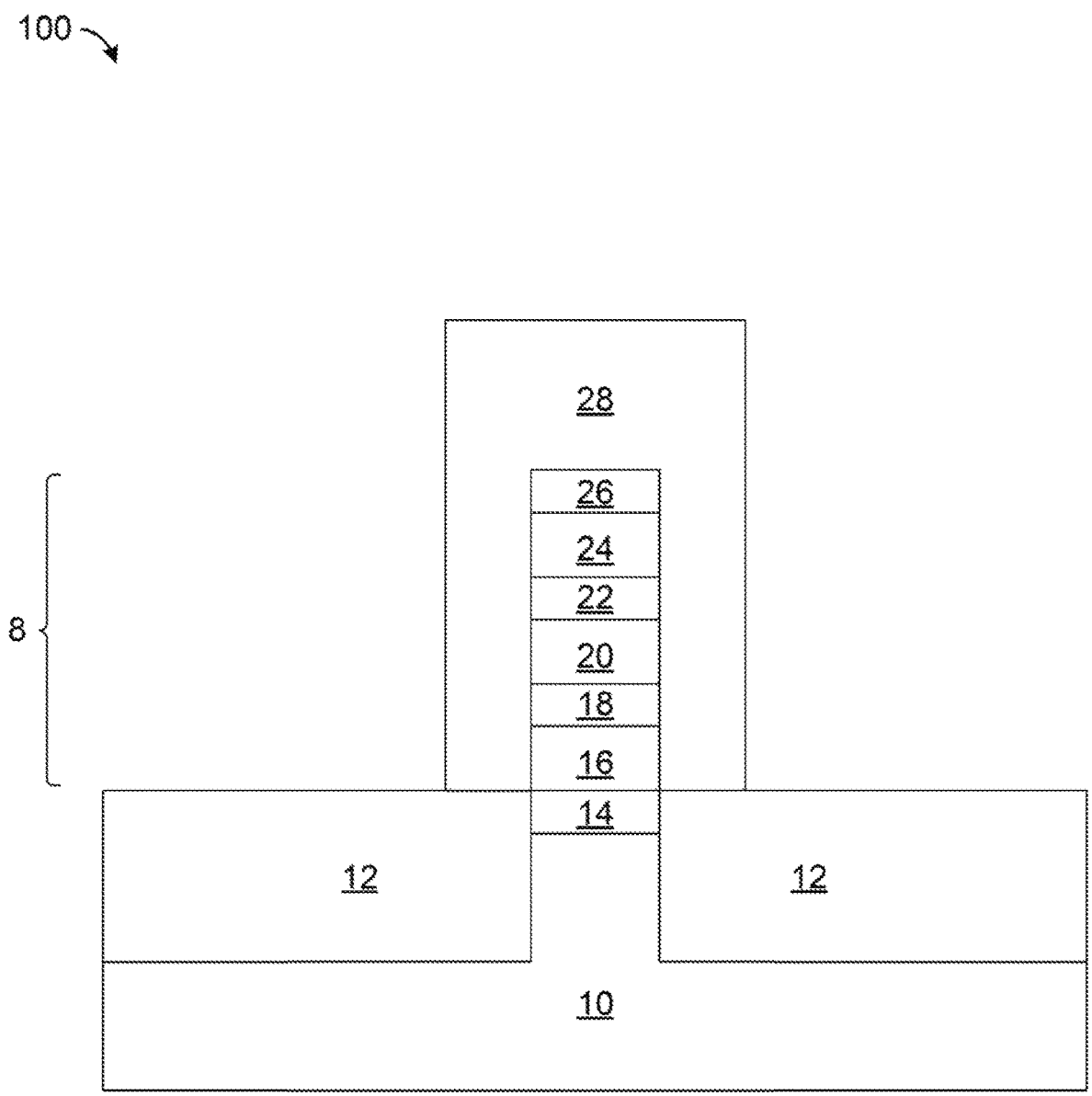
FIGS. 2 and 3 each illustrate a cross-sectional view of the semiconductor structure of FIG. 1 along sections A-A and B-B, respectively, according to an exemplary embodiment.
Figure 3:
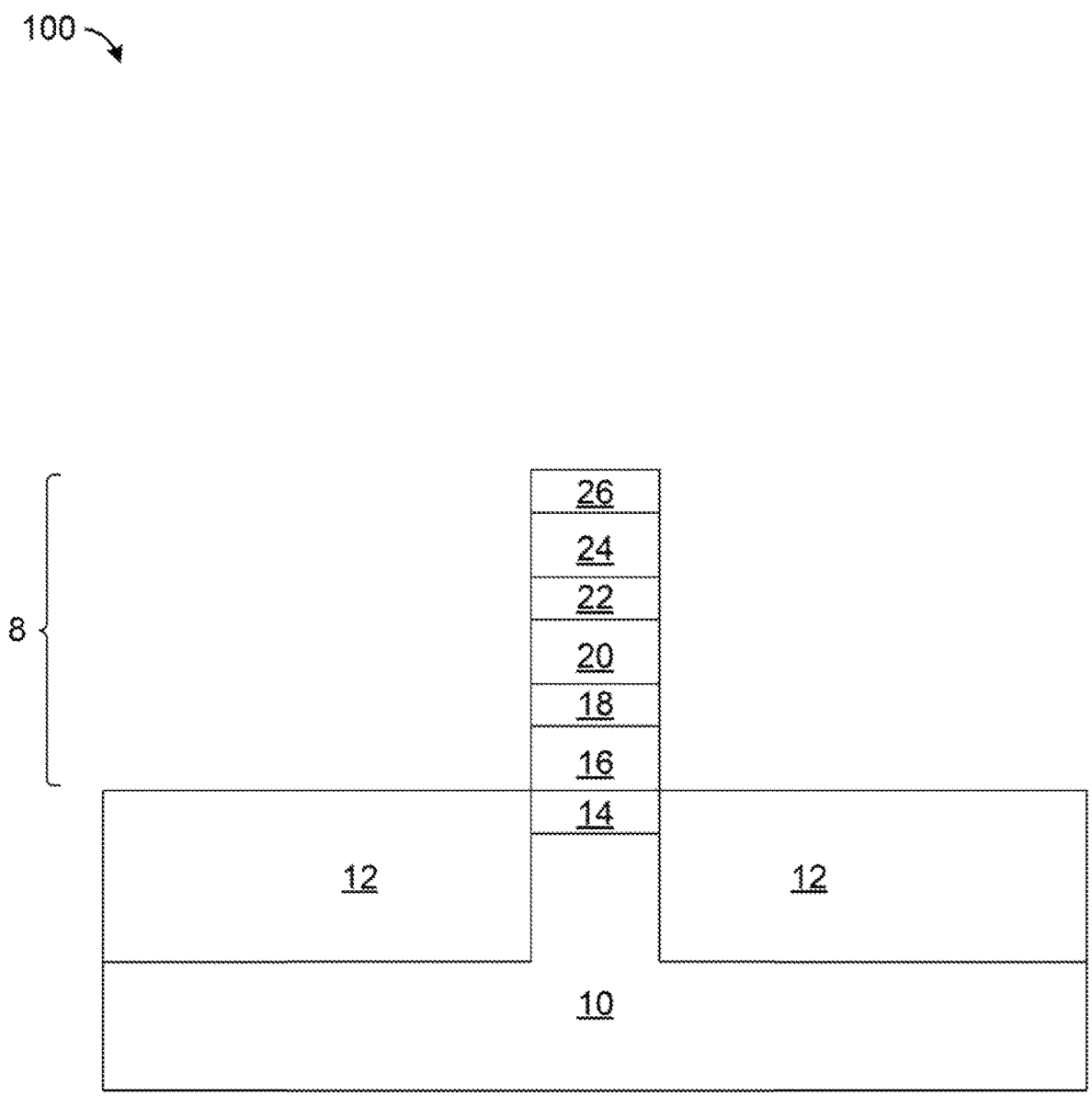

Referring now to FIGS. 1, 2 and 3, a semiconductor structure 100 (hereinafter "structure") at an intermediate stage of fabrication is shown according to an exemplary embodiment. FIG. 1 is a cross-sectional view of the structure 100 along a center line of a fin structure. FIG. 2 is a cross-sectional view of the structure 100 along section line A-A, illustrating a view perpendicular to a length of the fin structure. FIG. 3 is a cross-sectional view of the structure 100 along section line B-B, illustrating an additional view perpendicular to a length of the fin structure, and is parallel to the cross-sectional view of FIG. 2. The structure 100 of FIGS. 1-3 may be formed or provided.

The structure 100 may include a nanowire stack 8 on top of a substrate 10, a shallow trench isolation region (hereinafter "STI") 12, a dielectric 14 and a dummy gate 28. The nanowire stack 8 may include a first silicon germanium (hereinafter "$1^{st}$ SiGe") layer 16, a first silicon (hereinafter "$1^{st}$ Si") layer 18, a second silicon germanium (hereinafter "$2^{nd}$ SiGe") layer 20, a second silicon (hereinafter "$2^{nd}$ Si") layer 22, a third silicon germanium (hereinafter "$3^{rd}$ SiGe") layer 24, a third silicon (hereinafter "$3^{rd}$ Si") layer 26.

The substrate 10 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. Typically, the substrate 10 may be approximately, but is not limited to, several hundred microns thick.

In an embodiment, the dielectric 14, the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26 may be formed on the substrate 10, and subsequently, fins may be formed. The layers of the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26, may be each referred to as a nanosheet or nanowire. After formation of the nanowire stack 8, the STI 12 may be formed, and the dummy gate 28 may be formed.

At this step of the manufacturing process, the beginning structure of a nanosheet or nanowire field effect transistor (hereinafter "FET") is shown. The nanosheet FET may be formed on the substrate 10 according to techniques known in the art.

The dielectric 14 may be formed by conformally depositing or growing a dielectric material. The dielectric 14 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the dielectric 14 may include any dielectric material such as silicon oxide, silicon oxynitride, silicon nitride, SiBCN, SiOC, low-k dielectric or any combination of these materials.

Each of the layers in the nanowire stack 8 can be formed using an epitaxial growth process. For example, the $1^{st}$ SiGe layer 16 is formed on an exposed top surface of the dielectric 14 by an epitaxial process and have a germanium content of approximately 20%; the $1^{st}$ Si layer 18 may be formed by a subsequent epitaxial process on an exposed upper surface of the 1$^{st}$ SiGe layer 16; the 2$^{nd}$ SiGe layer 20 may be formed on an exposed upper surface of the 1$^{st}$ Si layer 18 by a further epitaxial process and have a germanium content of approximately 20%; the 2$^{nd}$ Si layer 22 may have been formed by a subsequent epitaxial process on an exposed upper surface of the 2$^{nd}$ SiGe layer 20; the 3$^{rd}$ SiGe layer 24 may be formed on an exposed upper surface of the 2$^{nd}$ Si layer 22 by a further epitaxial process and have a germanium content of approximately 20%; the 3rd Si layer 26 may have been formed by a subsequent epitaxial process on an exposed upper surface of the 3$^{rd}$ SiGe layer 24. A height or vertical thickness of each layer of the nanowire stack 8, may range from approximately 4 nm to approximately 10 nm.

Examples of various epitaxial growth techniques used in forming the various layers of the nanowire stack 8 may include, for example, rapid thermal chemical vapor deposition, low energy cluster beam deposition, ultra-high vacuum chemical vapor deposition, and atmospheric pressure chemical vapor deposition. The 1$^{st}$ SiGe layer 16, the 2$^{nd}$ SiGe layer 20 and the 3$^{rd}$ SiGe layer 24 may be doped during each epitaxy process (in-situ doping) or after the epitaxy process (ex-situ doping). A non-limiting list of exemplary epitaxial materials are: silicon germanium alloy (SiGe), silicon (Si), in-situ boron or gallium doped SiGe or Si, in situ phosphorus or arsenic doped Si or SiGe, with doping levels ranging from $1\times10^{19}$ cm$^3$ to $1.5\times10^{21}$ cm$^3$, with $4\times10^{20}$ cm$^3$ to $9\times10^{20}$ cm$^3$ dopant levels preferred.

A height of the nanowire stack 8 measured from a horizontal upper surface of substrate 10, including the height of the 1$^{st}$ SiGe layer 16, the height of the 1$^{st}$ Si layer 18, the height of the 2$^{nd}$ SiGe layer 20, the height of the 2$^{nd}$ Si layer 22, the height of the 3$^{rd}$ SiGe layer 24, and the height of the 3$^{rd}$ Si layer 26 may be approximately 30-60 nm.

In general, the structure 100 may include a plurality of fins formed on the substrate 10; however, only a single fin formed of the nanowire stack 8 is illustrated for clarity and brevity.

Subsequent to the formation of the fins, the STI 12 may be patterned and formed selectively between fins in order to isolate one device from neighboring devices.

In a replacement gate (RG) fabrication approach, the structure 100 may be patterned and etched to form active device region (e.g., fins). Next, one or more dummy gates 28 may be formed in a direction perpendicular to the length of the fins. For example, the dummy gates may be pattered and etched from a polysilicon layer. A pair of sidewall spacers can be disposed on opposite sidewalls of the dummy gates. The dummy gates and the pair of sidewall spacers may then be surrounded by an inter-level dielectric. Later, the dummy gates may be removed from between the pair of sidewall spacers. This creates an opening between the pair of sidewall spacers where a metal gate may then be formed between the pair of sidewall spacers. Optionally, a gate dielectric may be configured below the metal gate.

A plurality of nanosheet FET devices may be formed from each of a plurality of fins formed in a wafer, where each fin includes stacked nanosheets. Openings may be formed along a length of the fins. Source drain regions may be formed in each of the openings, forming a horizontal channel region along the nanosheets. The stacked nanosheets are released at certain process steps to have nanosheets suspended. A gate surrounding the exposed surfaces of nanosheets controls operation of the nanosheets.

Figure 4:
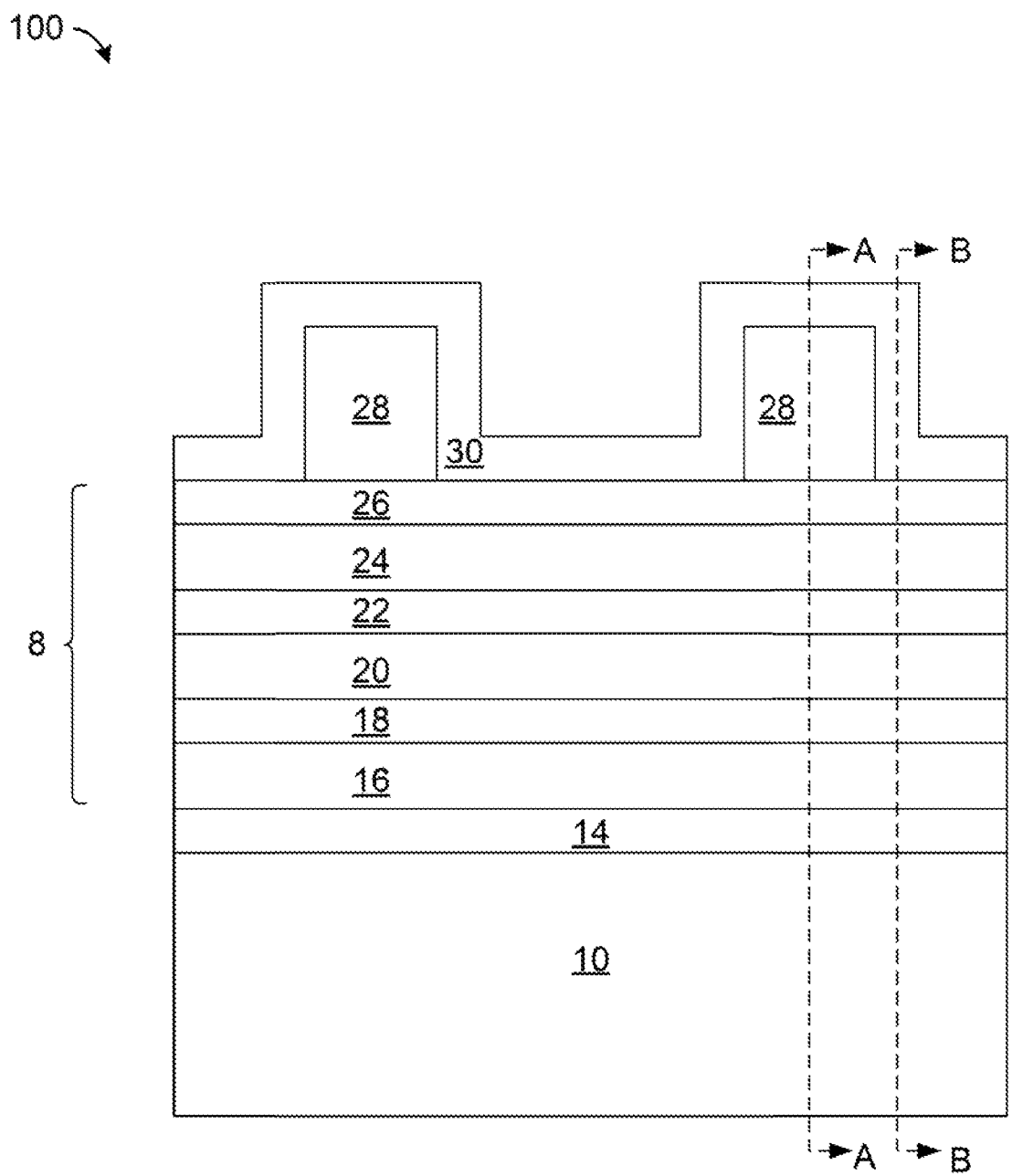
FIG. 4 illustrates a cross-sectional view of the semiconductor structure and illustrates forming a dummy gate spacer according to an exemplary embodiment.
Figure 5:
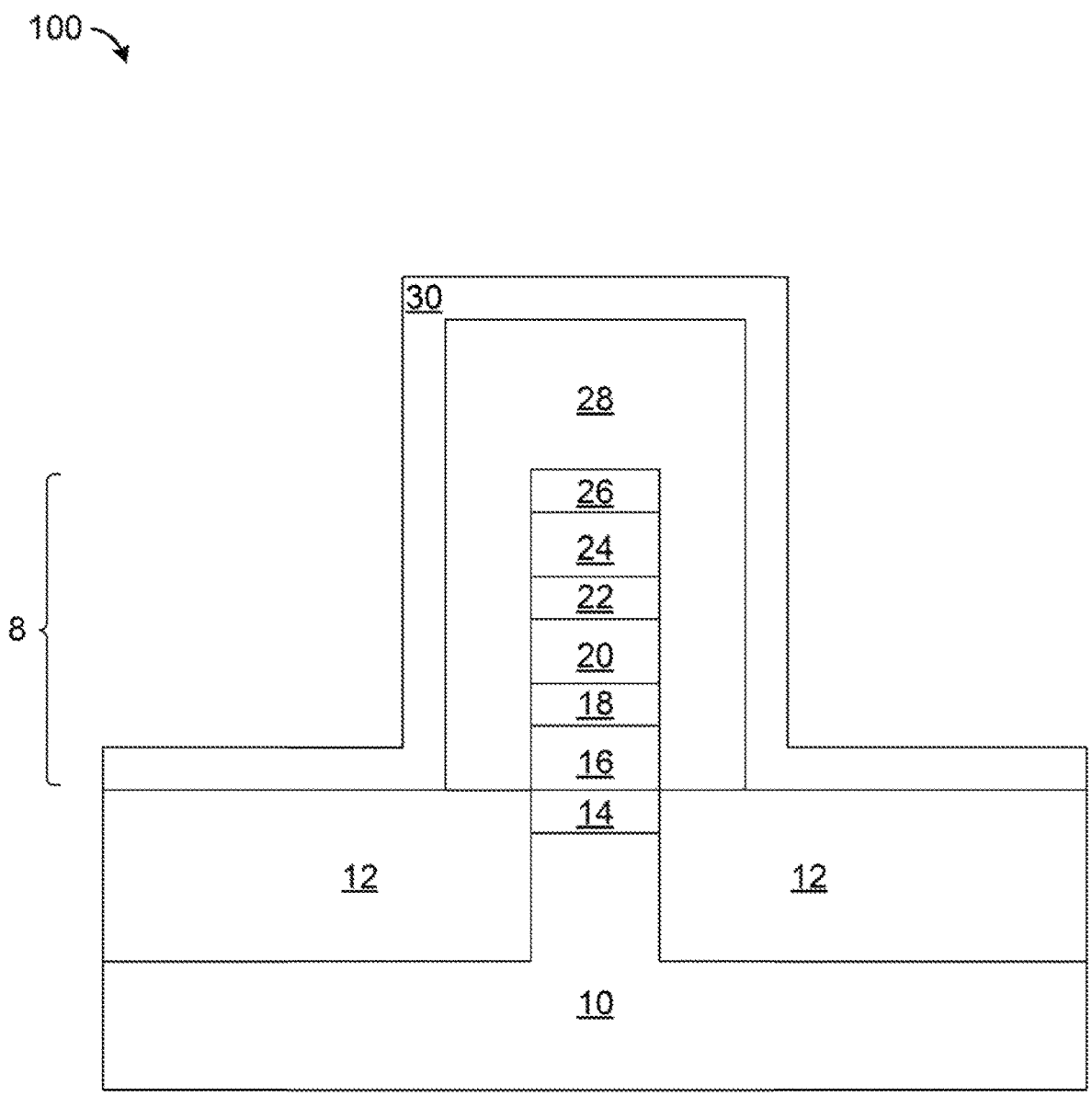
FIGS. 5 and 6 each illustrate a cross-sectional view of the semiconductor structure of FIG. 4 along sections A-A and B-B, respectively, according to an exemplary embodiment.
Figure 6:
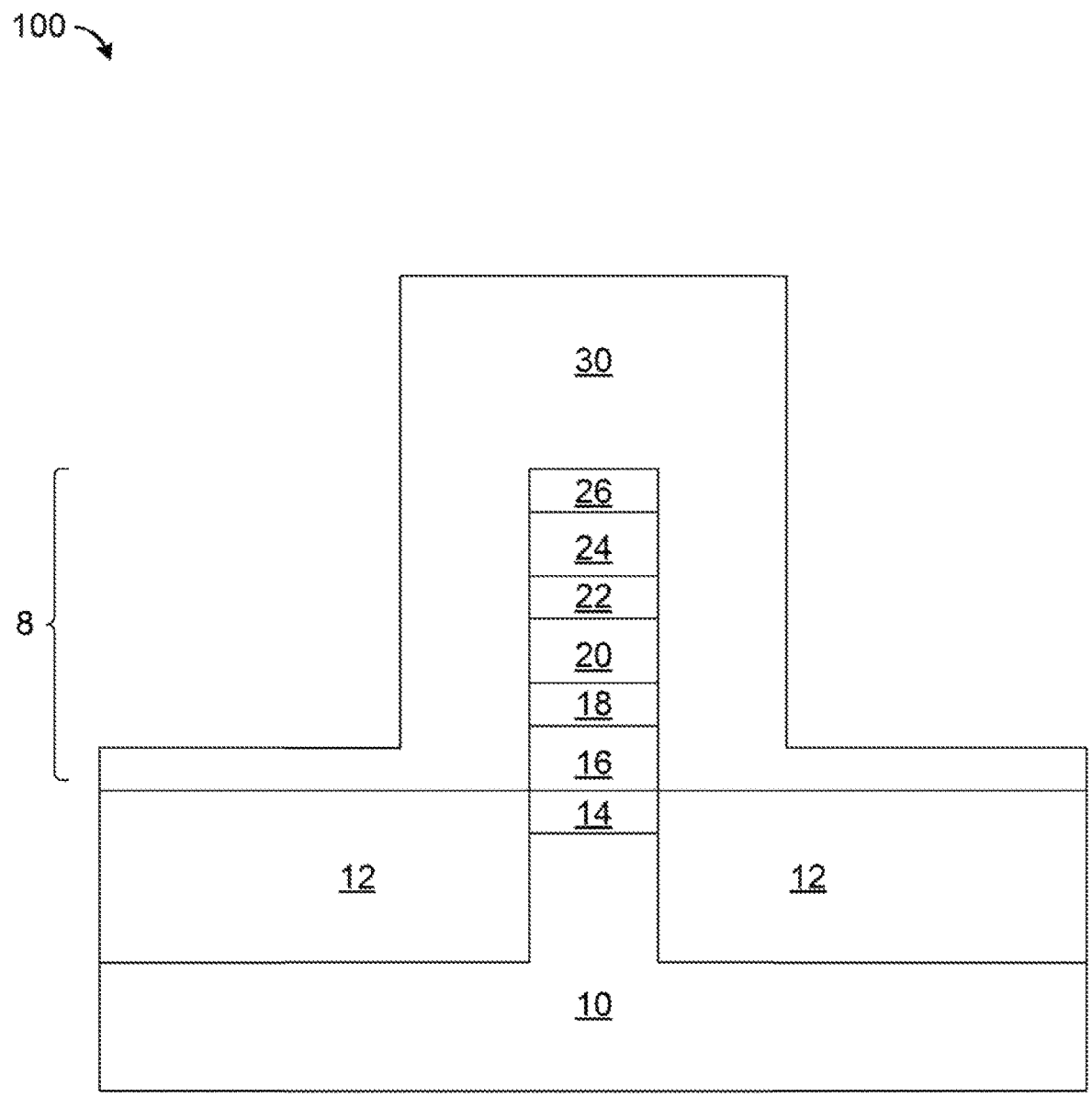

Referring now to FIGS. 4, 5 and 6, the structure 100 is shown according to an exemplary embodiment. FIG. 4 is a cross-sectional view of the structure 100 along a center line of the fin structure. FIG. 5 is a cross-sectional view of the structure 100 along section line A-A, illustrating a view perpendicular to a length of the fin structure. FIG. 6 is a cross-sectional view of the structure 100 along section line B-B, illustrating an additional view perpendicular to a length of the fin structure, and is parallel to the cross-sectional view of FIG. 5.

As shown in FIGS. 4, 5 and 6, a dummy gate spacer 30 may be conformally formed on the structure 100, according to an embodiment.

The dummy gate spacer 30 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the dummy gate spacer 30 may include one or more layers. In an embodiment, the dummy gate spacer 30 may include any dielectric material such as silicon oxide, silicon oxynitride, silicon nitride, SiBCN, SiOC, low-k dielectric or any combination of these materials. In an embodiment, the dummy gate spacer 30 may be a nitride. In an alternate embodiment, the dummy gate spacer 30 may be an oxide. In an embodiment, the dummy gate spacer 30 may have a thickness ranging from 5 to 10 nm, and ranges there between, although a thickness less than 5 nm and greater than 10 nm may be acceptable.

A lower horizontal surface of the dummy gate spacer 30 may be coplanar with an upper horizontal surface of the ILD 12. An inner vertical surface of the dummy gate spacer 30 may be coplanar with an outer horizontal surface of the dummy gate 28. A lower horizontal surface of the dummy gate spacer may be coplanar with an upper horizontal surface of the dummy gate 28.

Figure 7:
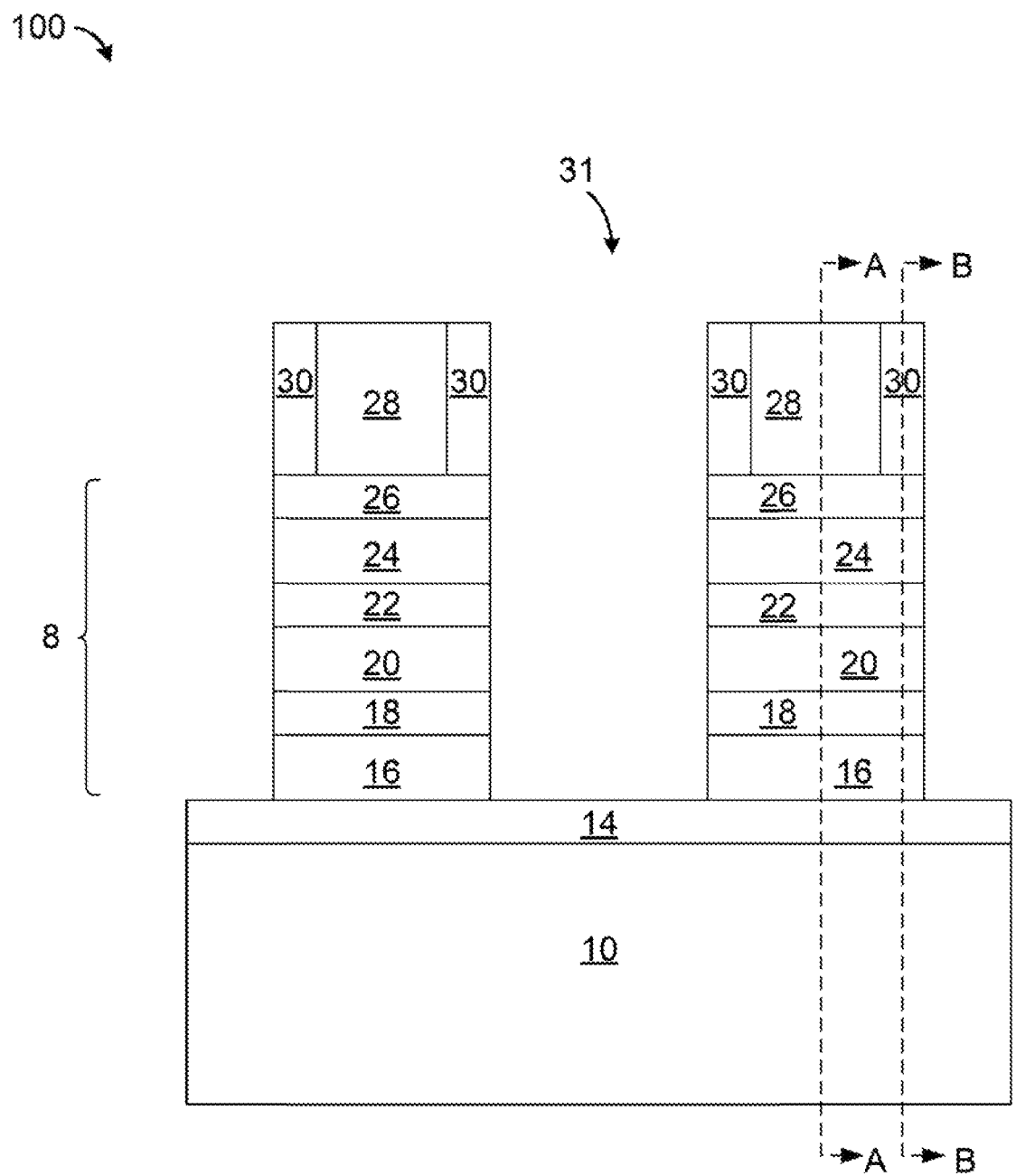
FIG. 7 illustrates a cross-sectional view of the semiconductor structure and illustrates forming a recess according to an exemplary embodiment.
Figure 8:
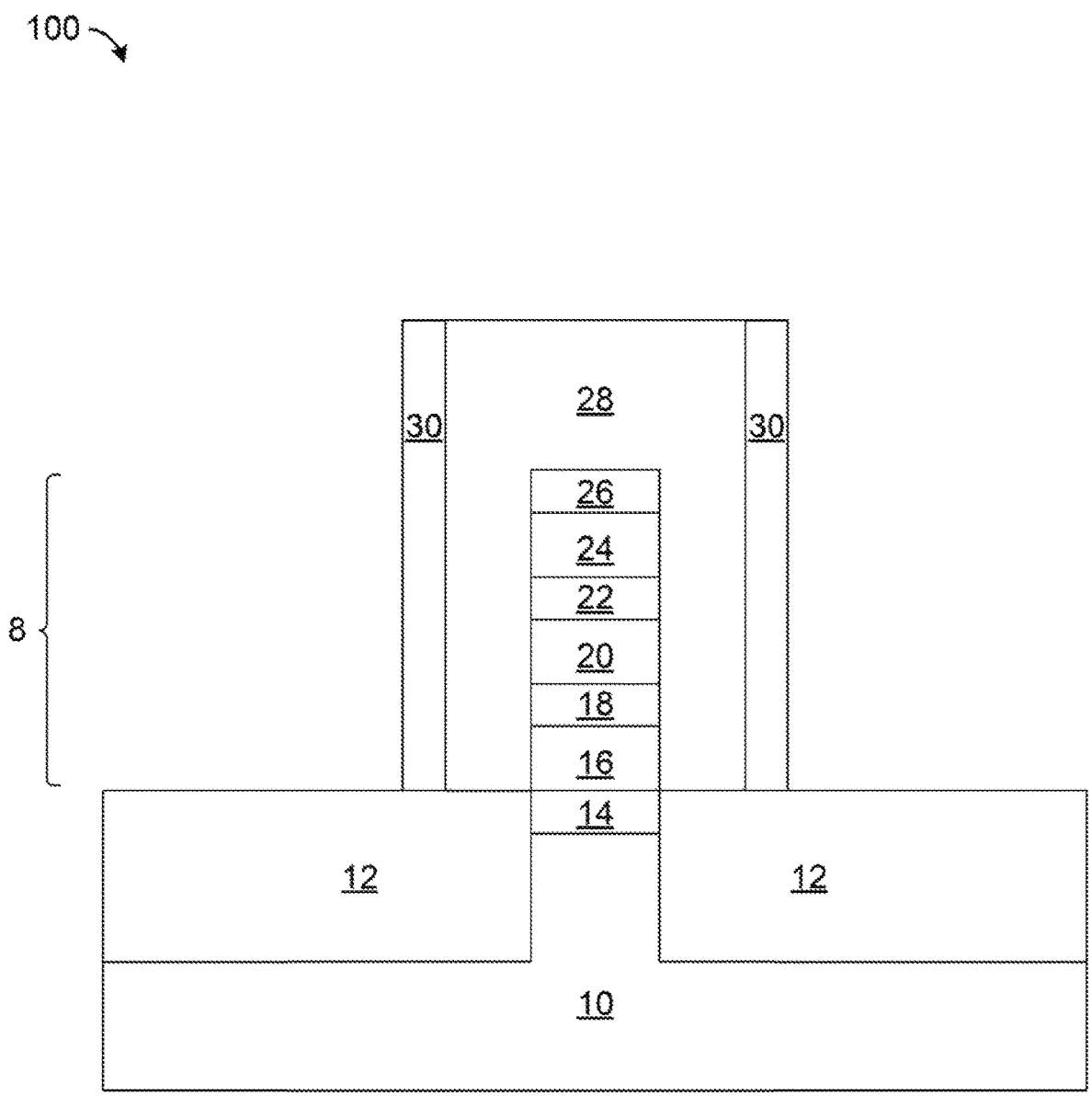
FIGS. 8 and 9 each illustrate a cross-sectional view of the semiconductor structure of FIG. 7 along sections A-A and B-B, respectively, according to an exemplary embodiment.
Figure 9:
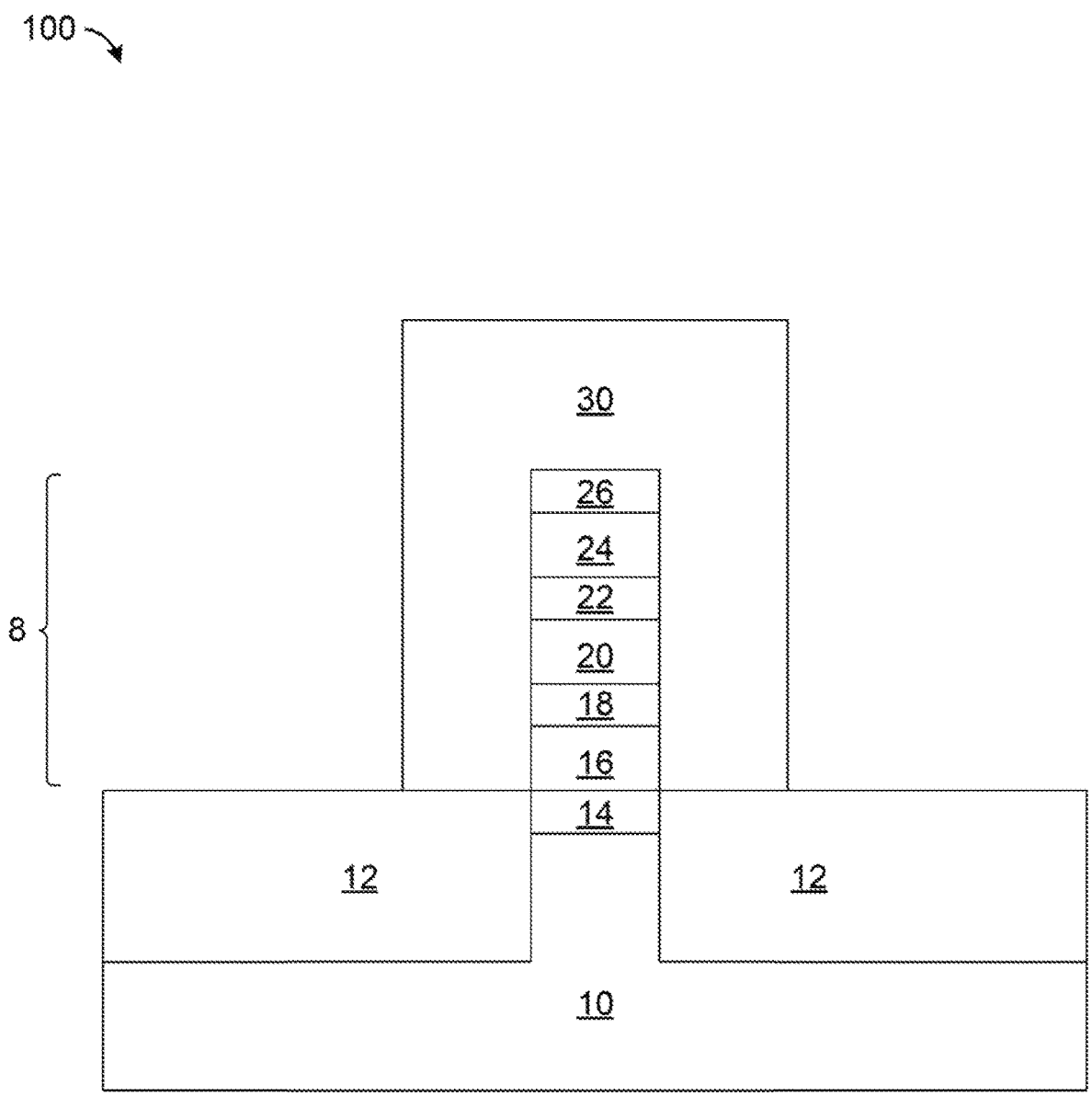

Referring now to FIGS. 7, 8 and 9, the structure 100 is shown according to an exemplary embodiment. FIG. 7 is a cross-sectional view of the structure 100 along a center line of the fin structure. FIG. 7 is a cross-sectional view of the structure 100 along section line A-A, illustrating a view perpendicular to a length of the fin structure. FIG. 8 is a cross-sectional view of the structure 100 along section line B-B, illustrating an additional view perpendicular to a length of the fin structure, and is parallel to the cross-sectional view of FIG. 7.

As shown in FIGS. 7, 8 and 9, the structure 100 may be selectively etched, for example by an anisotropic vertical etch process such as a reactive ion etch (RIE), or any suitable etch process. A portion of the dummy gate spacer 30 may be removed, and an opening 31 may be formed in the nanowire stack 8, according to an embodiment. The dummy gate spacer 30 may be removed from a portion of the upper horizontal surface of the ILD 12. The dummy gate spacer 30 may be removed from an exposed portion of upper horizontal surface of the dielectric 14. The dummy gate spacer may be removed from the upper horizontal surface of the dummy gate 28. The opening 31 may be formed by removal of a portion of the dummy gate spacer 30, a portion of the 1$^{st}$ SiGe layer 16, a portion of the 1$^{st}$ Si layer 18, a portion of the 2$^{nd}$ SiGe layer 20, a portion of the 2$^{nd}$ Si layer 22, a portion of the 3$^{rd}$ SiGe layer 24, and a portion of the 3$^{rd}$ Si layer 26 in an area between adjacent dummy gates 28 with surrounding dummy gate spacers 30. The formation of the opening 31 exposes a portion of an upper horizontal surface of the dielectric 14 and a vertical side surface of all the layers of the nanowire stack 8.

Figure 10:
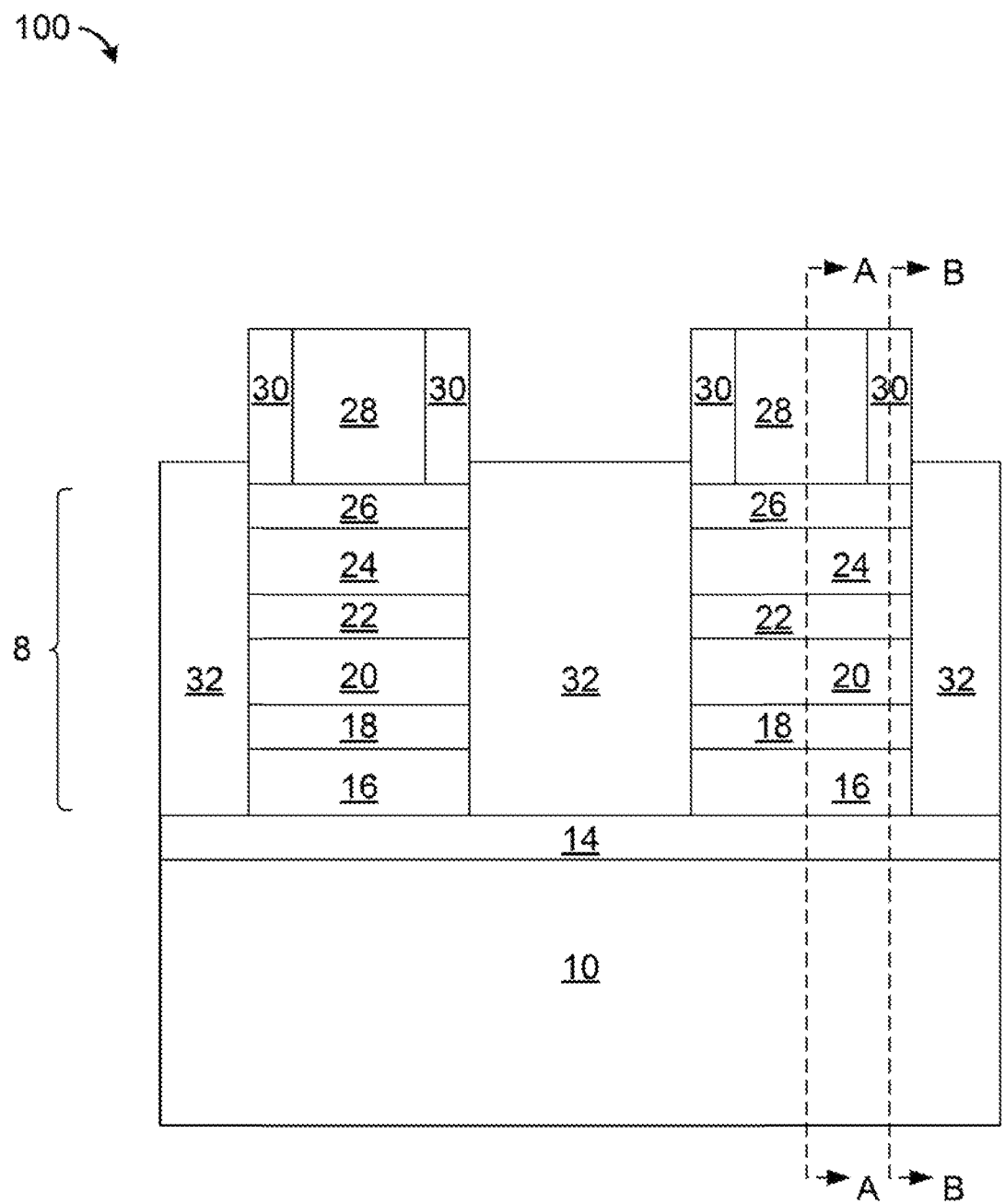
FIG. 10 illustrates a cross-sectional view of a semiconductor structure and illustrates growing an epitaxy, according to an exemplary embodiment.
Figure 11:
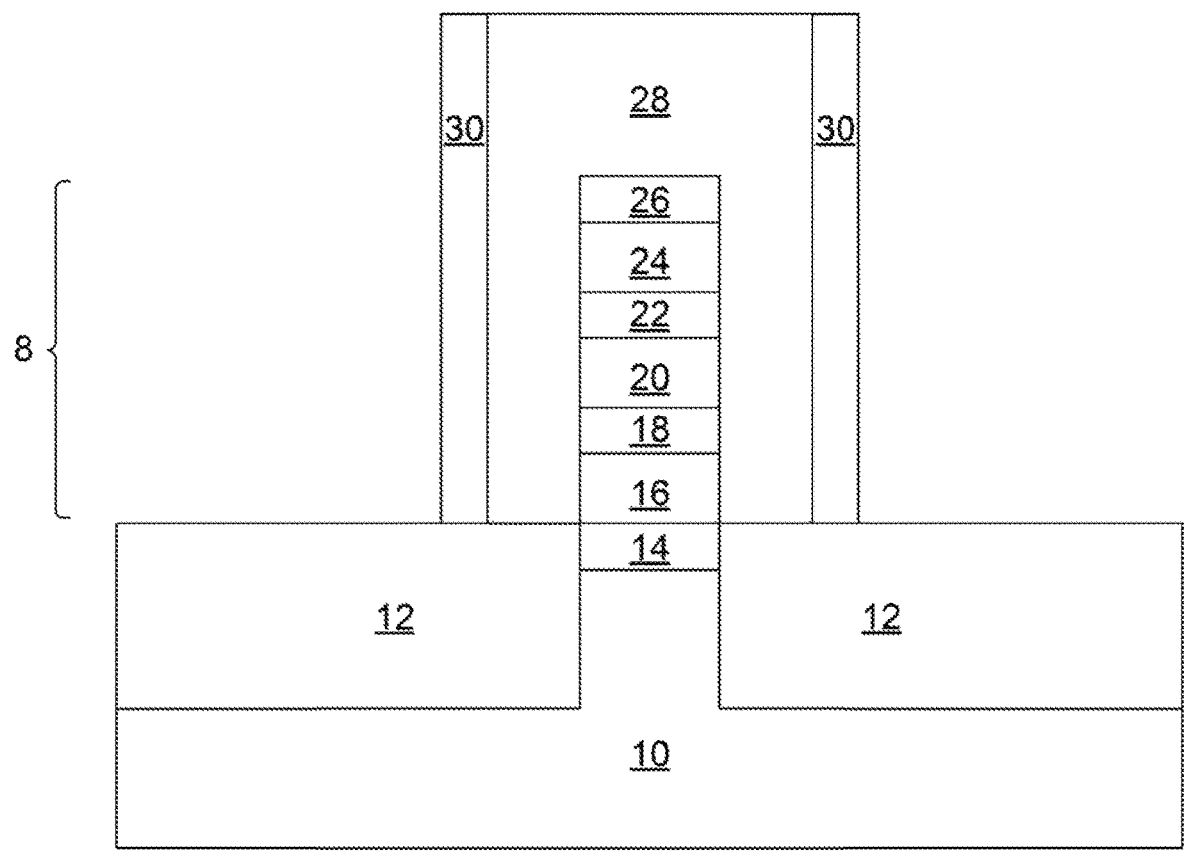
FIGS. 11 and 12 each illustrate a cross-sectional view of the semiconductor structure of FIG. 10 along sections A-A and B-B, respectively, according to an exemplary embodiment.
Figure 12:
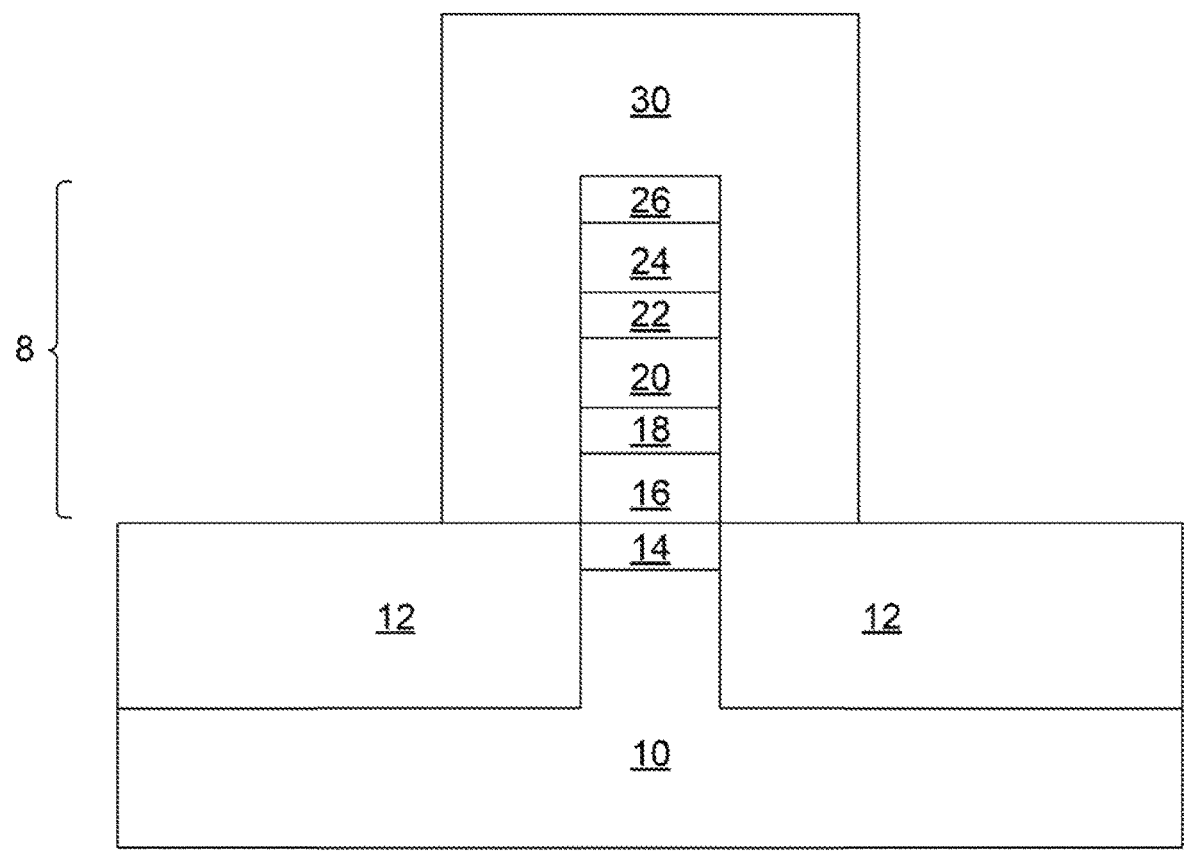

Referring now to FIGS. 10, 11 and 12, the structure 100 is shown according to an exemplary embodiment. FIG. 10 is a cross-sectional view of the structure 100 along a center line of the fin structure. FIG. 11 is a cross-sectional view of the structure 100 along section line A-A, illustrating a view perpendicular to a length of the fin structure. FIG. 12 is a cross-sectional view of the structure 100 along section line B-B, illustrating an additional view perpendicular to a length of the fin structure, and is parallel to the cross-sectional view of FIG. 11.

As shown in FIG. 10, an epitaxy 32 may be selectively grown in the opening 31, which is an opening along the length of the fins. There may be more than one opening 31. The epitaxy 32 may not be visible in the FIGS. 11 and 12. The epitaxy 32 may be grown as described above from the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26.

The epitaxy 32 may be grown from exposed vertical surfaces of the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26. In an embodiment, the epitaxy 32 may fill the opening 31. A horizontal lower surface of the epitaxy 32 may be coplanar with the horizontal upper surface of the dielectric 14. In an embodiment, excess material of the epitaxy 32 may be removed by conventional methods, such that a vertical side surface of the epitaxy 32 may be coplanar with the vertical side surfaces of the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26. A horizontal upper surface of the epitaxy 32 may extend higher than a horizontal top surface of the $3^{rd}$ Si layer 26, as measured from a horizontal top surface of the substrate 10. In an alternate embodiment, that the vertical side surface of the epitaxy 32 may extend wider than the vertical side surfaces of the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26.

The epitaxy 32 may include SiGe and may have a varying concentration of germanium in the epitaxy 32 due to its growth from the vertical side surfaces of the $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26. In an embodiment, a concentration of germanium along the lower horizontal surface of the epitaxy 32, and along the vertical side surface of the epitaxy 32 may be higher than a concentration of germanium towards a center of the epitaxy 32. In an embodiment, various concentrations of germanium are acceptable. In an embodiment, the concentration of germanium in the epitaxy 32 can be varied across its width/height?

The epitaxy 32 is in direct contact with the channels (the $1^{st}$ Si layer 18, the $2^{nd}$ Si layer 22, the $3^{rd}$ Si layer 26) and function as source drains for the nanowire FETs of the nanowire stack 8.

Figure 13:
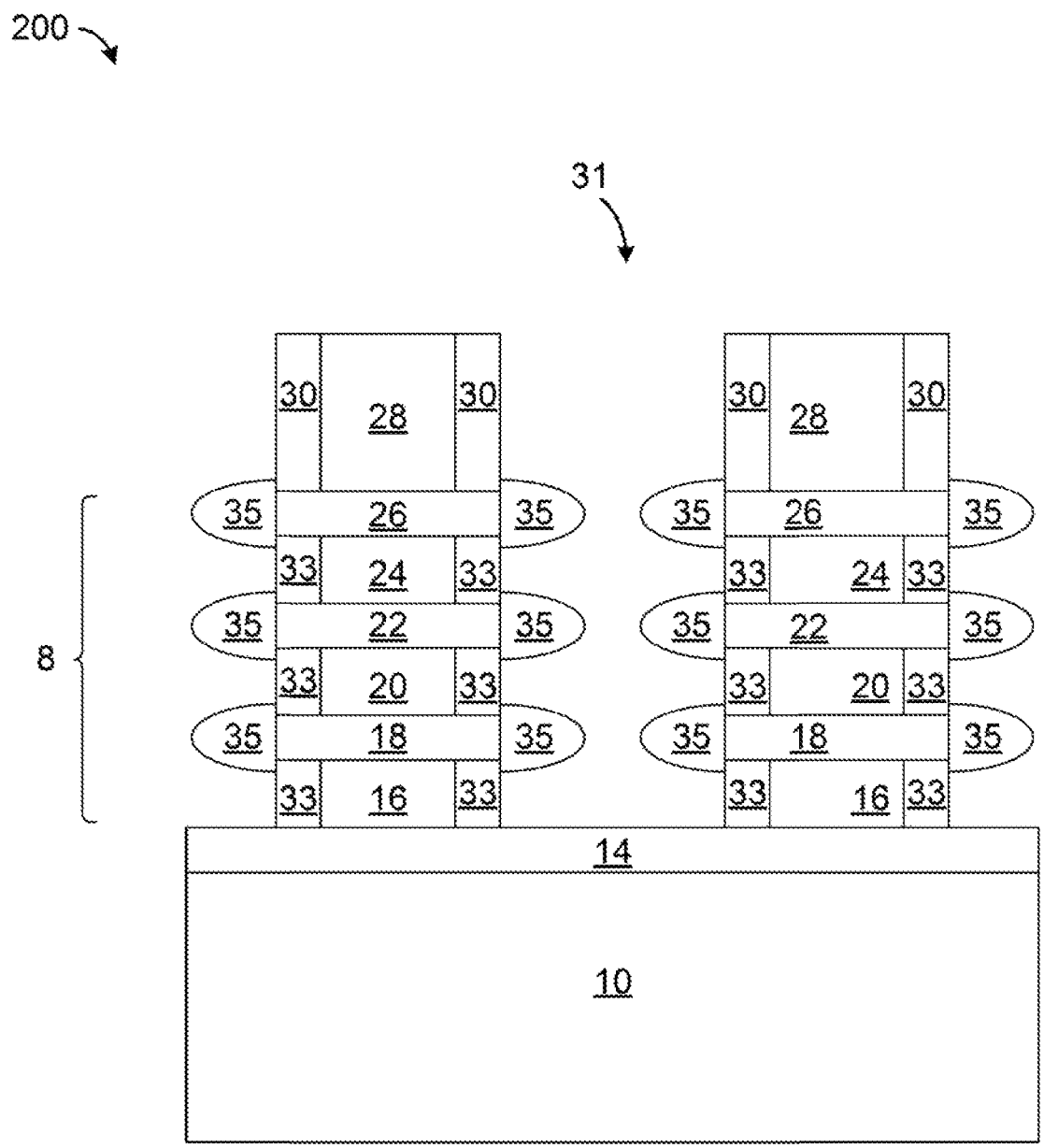
FIG. 13 illustrates a cross-sectional view of the semiconductor structure and illustrates growing an epitaxy, according to an alternate embodiment.

Referring now to FIG. 13, a structure 200 with an epitaxy 35 is shown according to a different embodiment. FIG. 13 is presented for purposes of comparison and to illustrate an alternative technique used to form epitaxial source drain regions in a nanosheet FET compared to the structure 100 shown in the rest of the Figures.

FIG. 13 is a cross-sectional view of the structure 200 along a center line of a fin structure. As shown in FIG. 13, when the opening 31 is formed, a vertical side surface of the SiGe layer 16, a vertical side surface of the $2^{nd}$ SiGe layer 20, and a vertical side surface of the $3^{rd}$ Si layer 24 may be recessed, and subsequently a liner 33 may be formed in these recesses. In this embodiment, the $1^{st}$ SiGe layer 16, the $2^{nd}$ SiGe layer 20, and the $3^{rd}$ Si layer 26 may not have an exposed vertical side surface. Additional processing steps may be utilized to recess the SiGe layer 16, the $2^{nd}$ SiGe layer 20 and the $3^{rd}$ SiGe layer 24, and to form the liner 33 in these recesses.

Subsequently, in this embodiment, source drain epitaxy 35 are grown from an exposed vertical side surface of only the $1^{st}$ Si layer 18, an exposed vertical side surface of the $2^{nd}$ Si layer 22, and an exposed vertical side surface of the $3^{rd}$ Si layer 26. The source drain epitaxy 35 may only fill a portion of the opening 31 and may have a lower lattice constant in contrast with the source drain epitaxy grown in the structure 100, described and illustrated above. Additionally, the source drain epitaxy 32 (as shown in FIGS. 10, 11, 12) is grown from exposed vertical sidewalls of all layers in the nanowire stack 8, rather only the Si layers of the structure 200 illustrated in FIG. 13. The source drain epitaxy 35 may have a high defectivity, there is almost no strain generated from the epitaxy 35 growth and the epitaxy growth may not be uniform. Alternatively, epitaxy grown with a lower defectivity, a higher strain and uniform growth will have an improved performance as a source drain region, as the epitaxy 32 has been grown.

Figure 14:
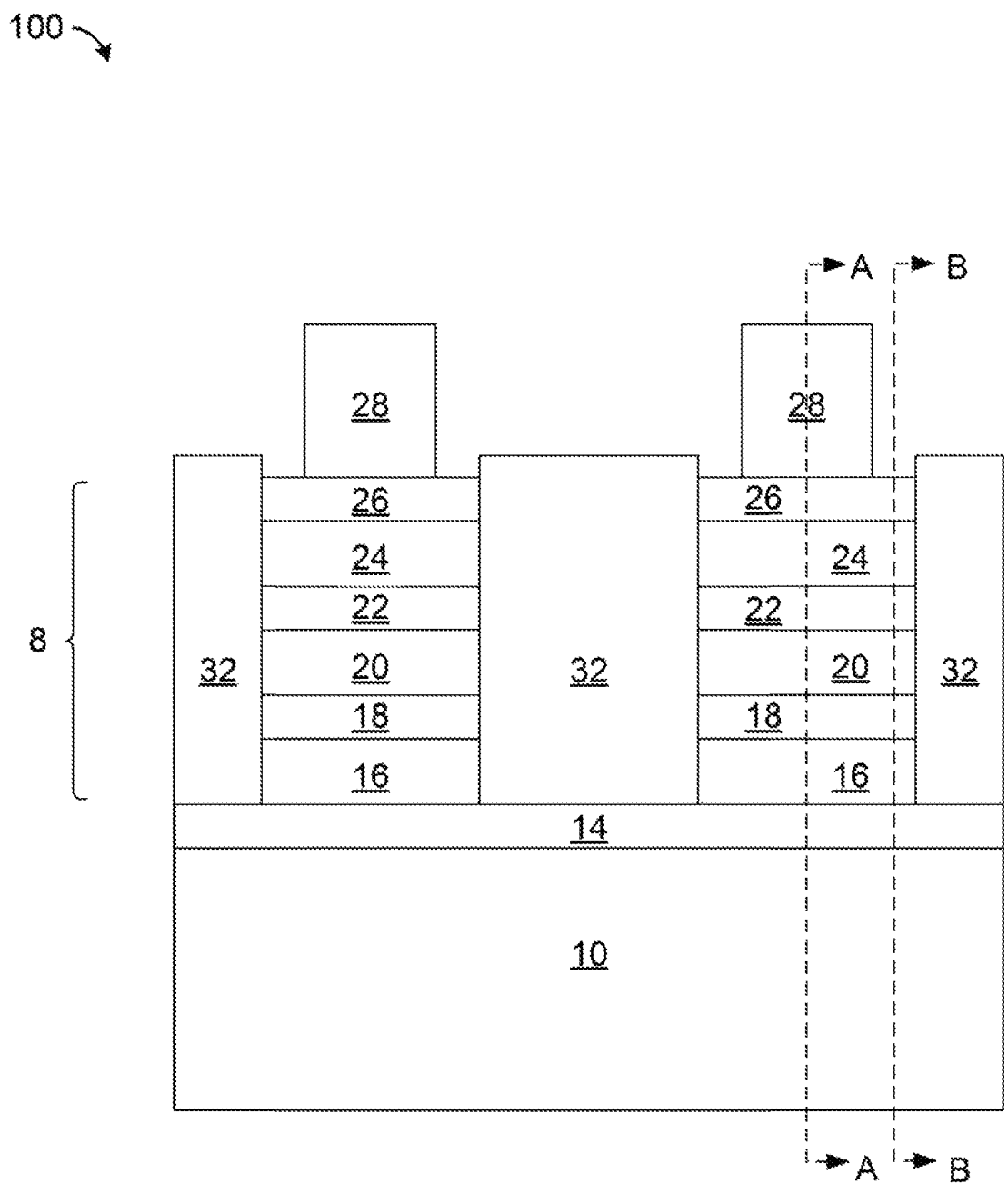
FIG. 14 illustrates a cross-sectional view of the semiconductor structure and illustrates removing the dummy gate spacer, according to an exemplary embodiment.
Figure 15:
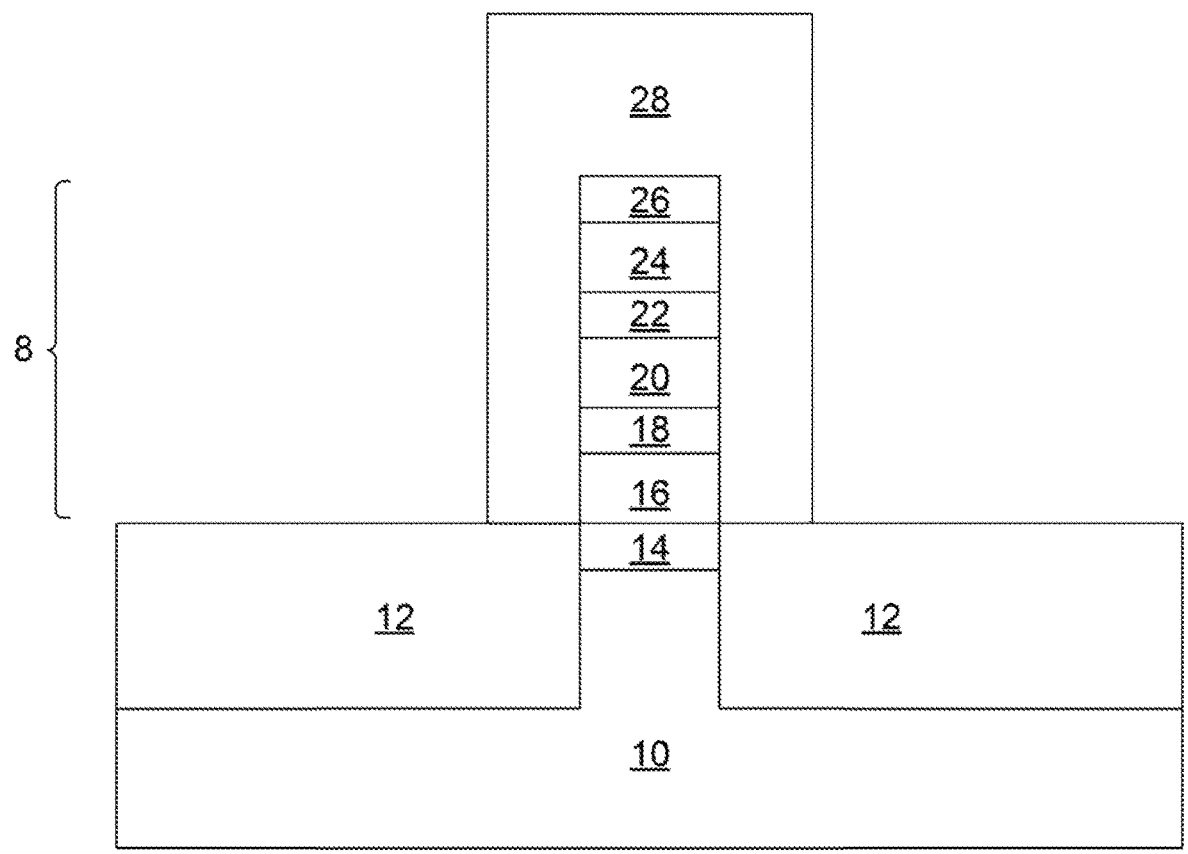
FIGS. 15 and 16 each illustrate a cross-sectional view of the semiconductor structure of FIG. 14 along sections A-A and B-B, respectively, according to an exemplary embodiment.
Figure 16:
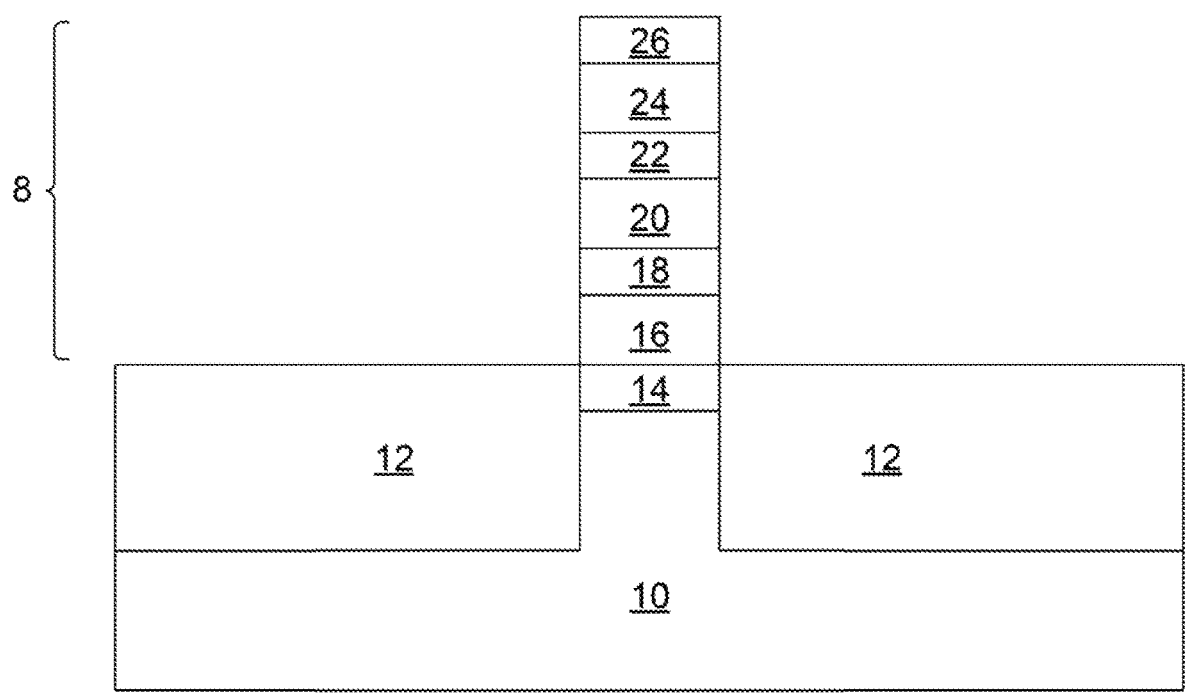

Referring now to FIGS. 14, 15 and 16, the structure 100 is shown according to an exemplary embodiment. FIG. 14 is a cross-sectional view of the structure 100 along a center line of the fin structure. FIG. 15 is a cross-sectional view of the structure 100 along section line A-A, illustrating a view perpendicular to a length of the fin structure. FIG. 16 is a cross-sectional view of the structure 100 along section line B-B, illustrating an additional view perpendicular to a length of the fin structure, and is parallel to the cross-sectional view of FIG. 15.

As shown in FIG. 14, the dummy gate spacer 30 may be selectively removed using known techniques, using either a wet or dry etch process, with a selectively chemistry to remove the dummy gate spacer 30. For example, the dummy gate spacer 30 may be removed by a wet etching process or WETS. The wet etching processes may employ special chemical solutions including, for example, tetramethylammonium hydroxide (TMAH) solution, potassium hydroxide (KOH) solution, and ethylene diamine and pyrocatechol (EDP) solution. Alternatively, a wet etching processes that relies on a mixture solution of for example HF-HNO3-H2SO4, may be used. The material used for the etching process may be selective such that the epitaxy 32, the dummy gate 28, $1^{st}$ SiGe layer 16, the $1^{st}$ Si layer 18, the $2^{nd}$ SiGe layer 20, the $2^{nd}$ Si layer 22, the $3^{rd}$ SiGe layer 24, and the $3^{rd}$ Si layer 26 remain and are not etched.

Removal of the dummy gate spacer 30 exposes portions of the nanowire stack 8 which are not covered by the dummy gate 28. For example, portions of the $1^{st}$ SiGe layer 16, the $2^{nd}$ SiGe layer 20, and the $3^{rd}$ SiGe layer 24, all of which are sacrificial layers, are exposed. Additional, portions of the $1^{st}$ Si layer 18, portions of the $2^{nd}$ Si layer 22 and portions of the $3^{rd}$ Si layer 26 are also exposed.

Figure 17:
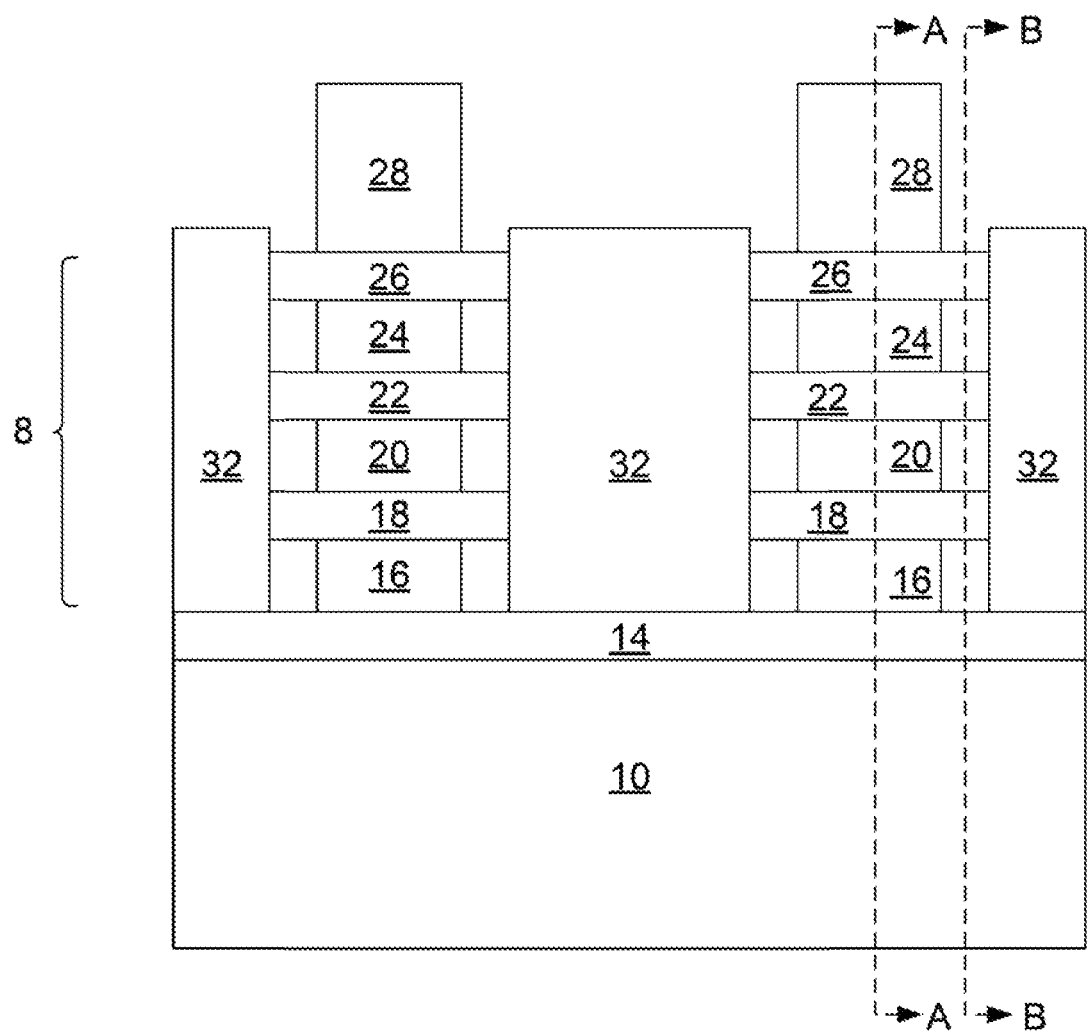
FIG. 17 illustrates a cross-sectional view of the semiconductor structure and illustrates removing a sacrificial silicon germanium layer, according to an exemplary embodiment.
Figure 18:
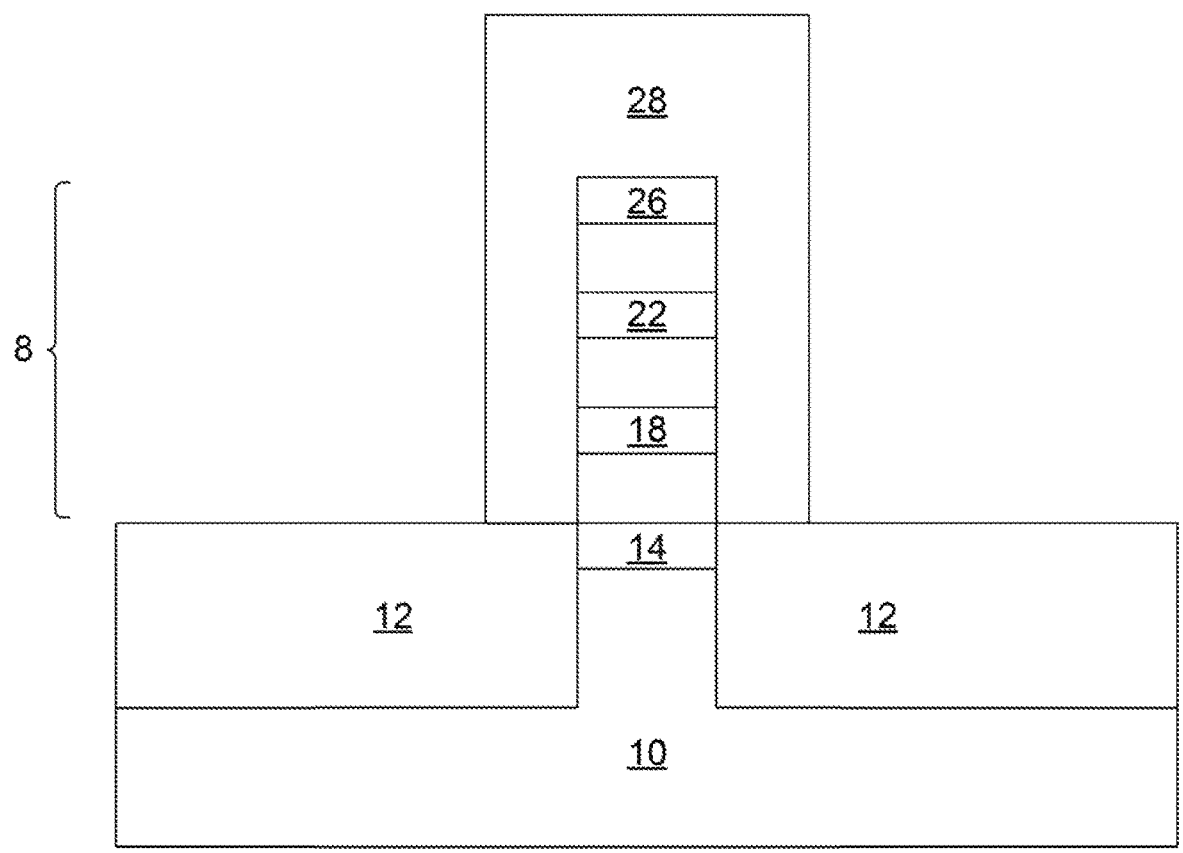
FIGS. 18 and 19 each illustrate a cross-sectional view of the semiconductor structure of FIG. 17 along sections A-A and B-B, respectively, according to an exemplary embodiment.
Figure 19:
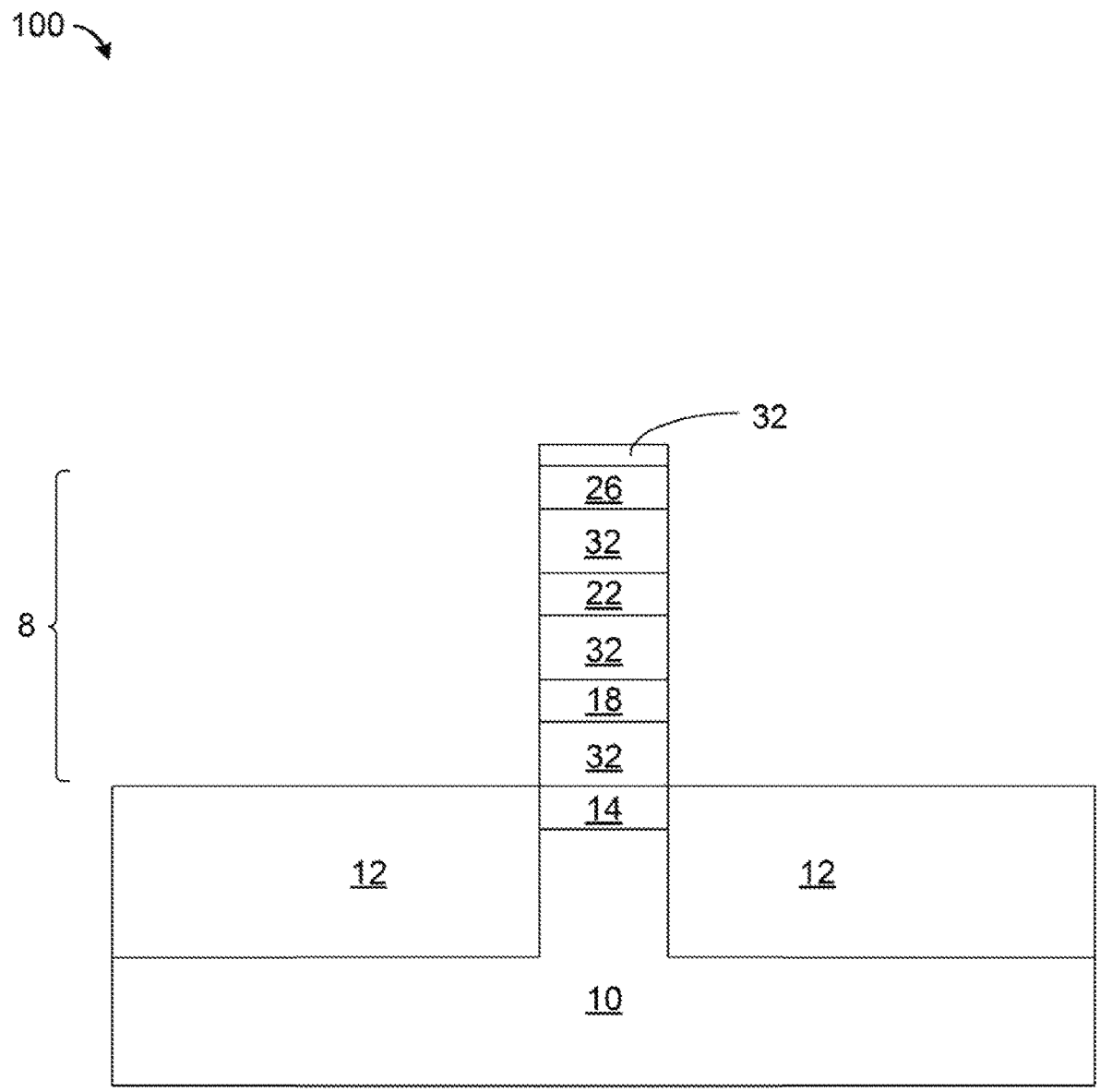

Referring now to FIGS. 17, 18 and 19, the structure 100 is shown according to an exemplary embodiment. FIG. 17 is a cross-sectional view of the structure 100 along a center line of the fin structure. FIG. 18 is a cross-sectional view of the structure 100 along section line A-A, illustrating a view perpendicular to a length of the fin structure. FIG. 19 is a cross-sectional view of the structure 100 along section line B-B, illustrating an additional view perpendicular to a length of the fin structure, and is parallel to the cross-sectional view of FIG. 18.

As shown in FIGS. 17, 18 and 19, portions of the SiGe layers (the $1^{st}$ SiGe layer 16, the $2^{nd}$ SiGe layer 20, the $3^{rd}$ SiGe layer 24) of the nanowire stack 8 may be selectively removed using known techniques. For example, a wet or dry etch process can be used with the appropriate chemistry to remove portions of each of the three SiGe layers. The material used for the etching process may be selective such that the epitaxy 32, the dummy gate 28, the $1^{st}$ Si layer 18, the $2^{nd}$ Si layer 22 and the $3^{rd}$ Si layer 26 remain and are not etched. After etching, portions of the SiGe layers covered on opposite sides by the dummy gate 28 may remain as part of the nanowire stack 8. In such cases, the dummy gate 28 supports the remaining Si layers (the $1^{st}$ Si layer 16, the $2^{nd}$ Si layer 20, the $3^{rd}$ Si layer 26) of the nanowire stack 8. A space may be open between the epitaxy 32 and each of the $1^{st}$ SiGe layer 16, the $2^{nd}$ SiGe layer 20 and the $3^{rd}$ SiGe layer 24, in areas between the dummy gate 28. The space may be open between each of the $1^{st}$ Si layer 18 and the $2^{nd}$ Si layer 22 and between the $2^{nd}$ Si layer 22 and the $3^{rd}$ Si layer 26.

Figure 20:
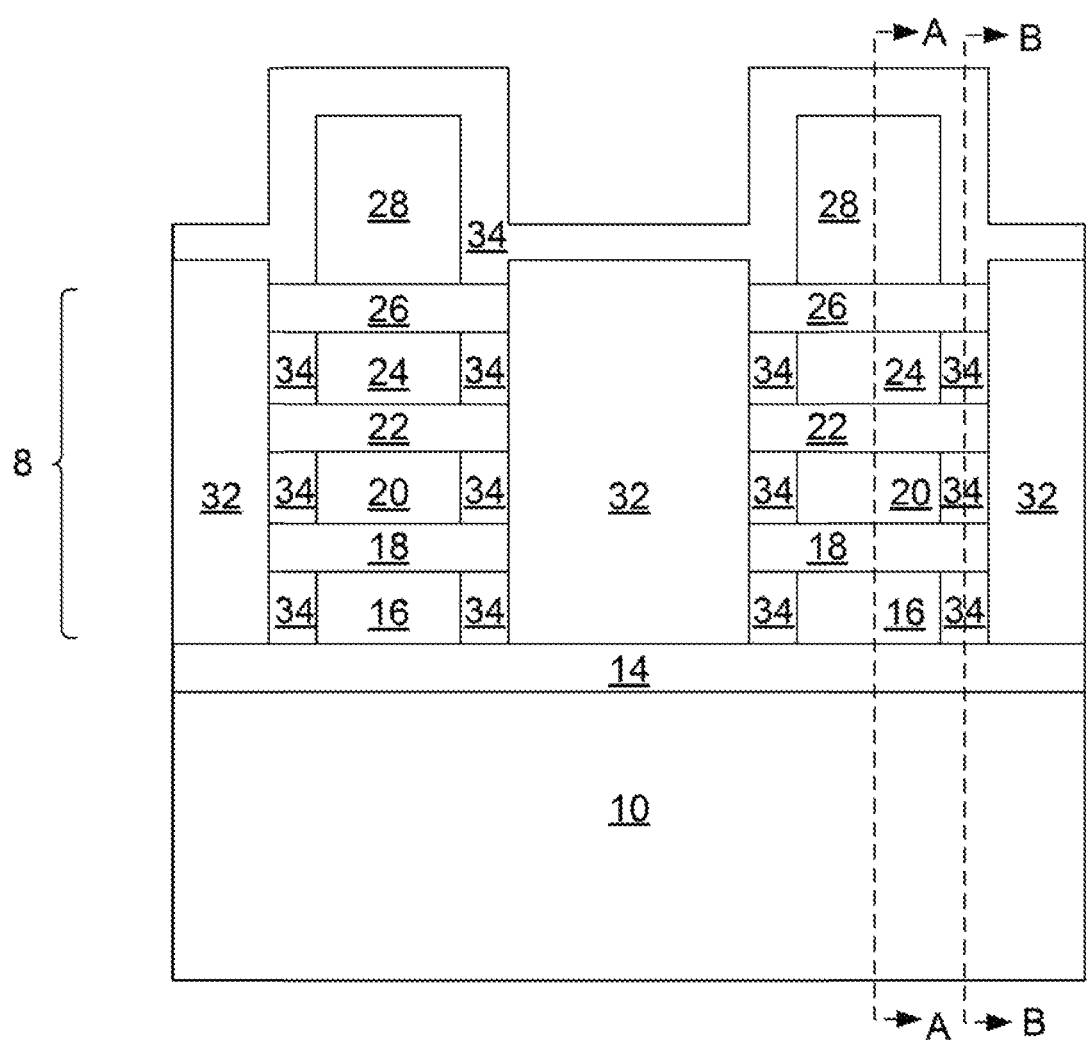
FIG. 20 illustrates a cross-sectional view of the semiconductor structure and illustrates deposition of a spacer, according to an exemplary embodiment.
Figure 21:
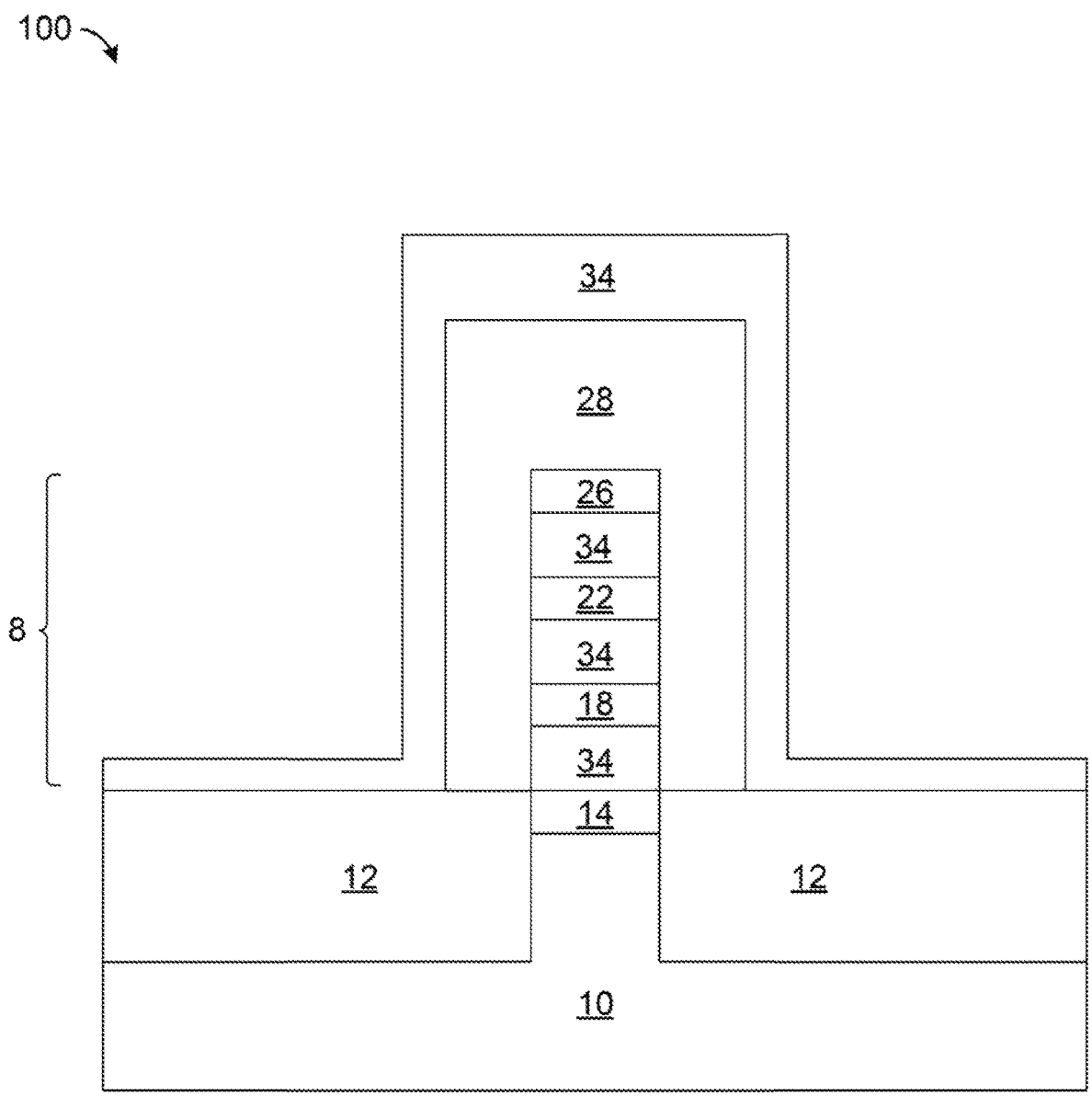
FIGS. 21 and 22 each illustrate a cross-sectional view of the semiconductor structure of FIG. 20 along sections A-A and B-B, respectively, according to an exemplary embodiment.
Figure 22:
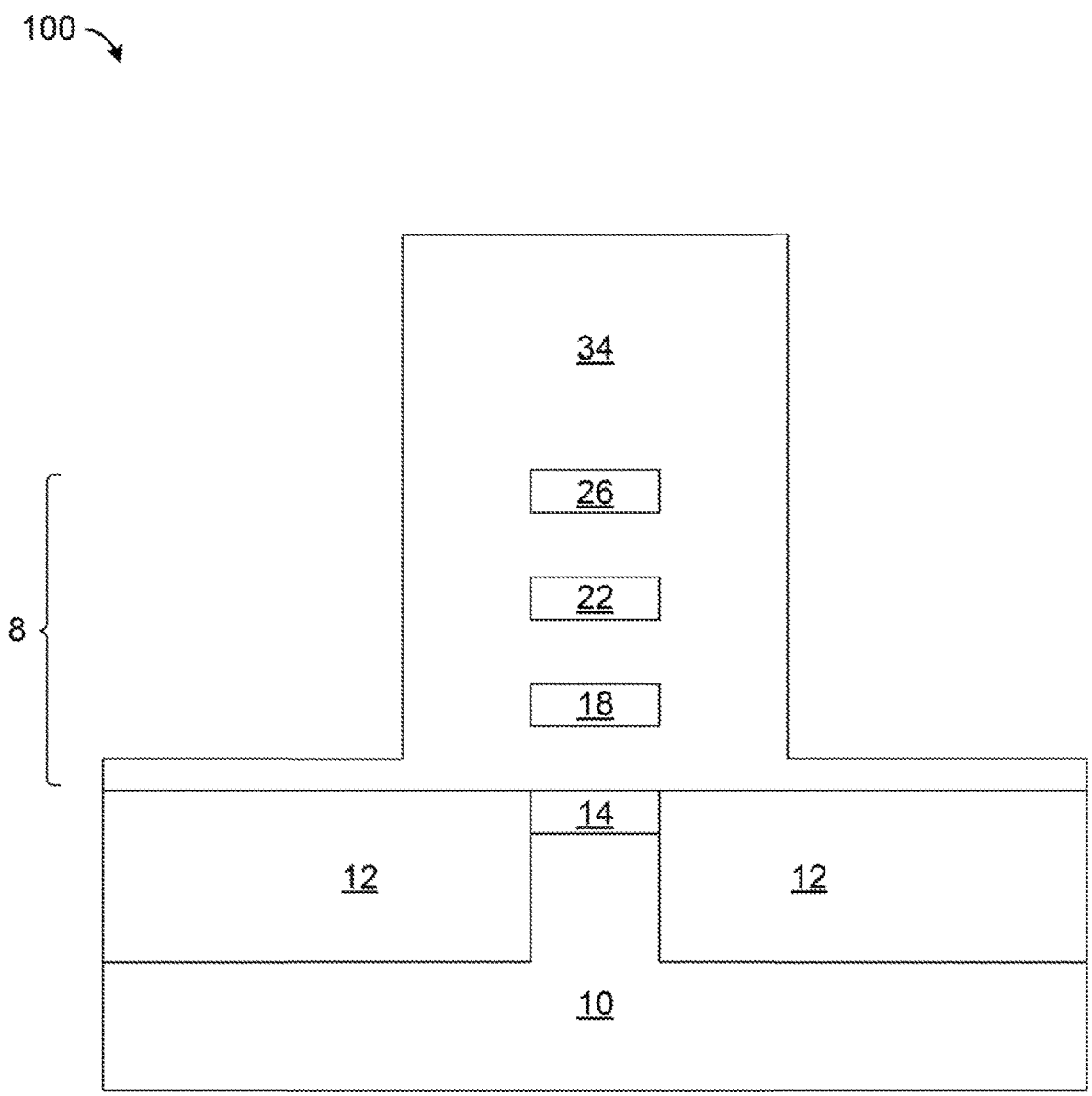

Referring now to FIGS. 20, 21 and 22, the structure 100 is shown according to an exemplary embodiment. FIG. 20 is a cross-sectional view of the structure 100 along a center line of the fin structure. FIG. 21 is a cross-sectional view of the structure 100 along section line A-A, illustrating a view perpendicular to a length of the fin structure. FIG. 22 is a cross-sectional view of the structure 100 along section line B-B, illustrating an additional view perpendicular to a length of the fin structure, and is parallel to the cross-sectional view of FIG. 21.

As shown in FIGS. 20, 21 and 22, a low-k spacer 34 may be formed. The low-k spacer 34 may be formed by conformally depositing or growing a dielectric material, followed by a combination of dry and wet anisotropic etch and recessing steps. The low-k spacer 34 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the low-k spacer 34 may include one or more layers. In an embodiment, the low-k spacer 34 may include any dielectric material such as silicon oxide, silicon oxynitride, silicon nitride, SiBCN, SiOC, low-k dielectric or any combination of these materials. In an embodiment, the low-k spacer 34 may be nitride. In an alternate embodiment, the low-k spacer 34 may be oxide. In an embodiment, the low-k spacer 34 may have a vertical thickness ranging from about 10 nm to about 20 nm above a horizontal upper surface of the dummy gate 28, above a vertical surface of the dummy gate 28 and above a horizontal upper surface of the epitaxy 32, and ranges there between, although a thickness less than 10 nm greater than 20 nm may be acceptable.

The low-k spacer 34 may completely fill in spaces between the $1^{st}$ Si layer 18, the $2^{nd}$ Si layer 22 and the $3^{rd}$ Si layer 26, where the $1^{st}$ SiGe layer 16, the $2^{nd}$ SiGe layer 20 and the $3^{rd}$ SiGe layer 24 had been previously removed. A first space between the epitaxy 32, the dielectric 14, the $1^{st}$ SiGe layer 16 and the $1^{st}$ Si layer 18 may be filled by the low-k spacer 34. A second space between the epitaxy 32, the $1^{st}$ Si layer 18, the $2^{nd}$ SiGe layer 20 and the $2^{nd}$ Si layer 22 may be filled by the low-k spacer 34. A third space between the epitaxy 32, the $2^{nd}$ Si layer 22, the $3^{rd}$ SiGe layer 24 and the $3^{rd}$ Si layer 26 may be filled by the low-k spacer 34.

Figure 23:
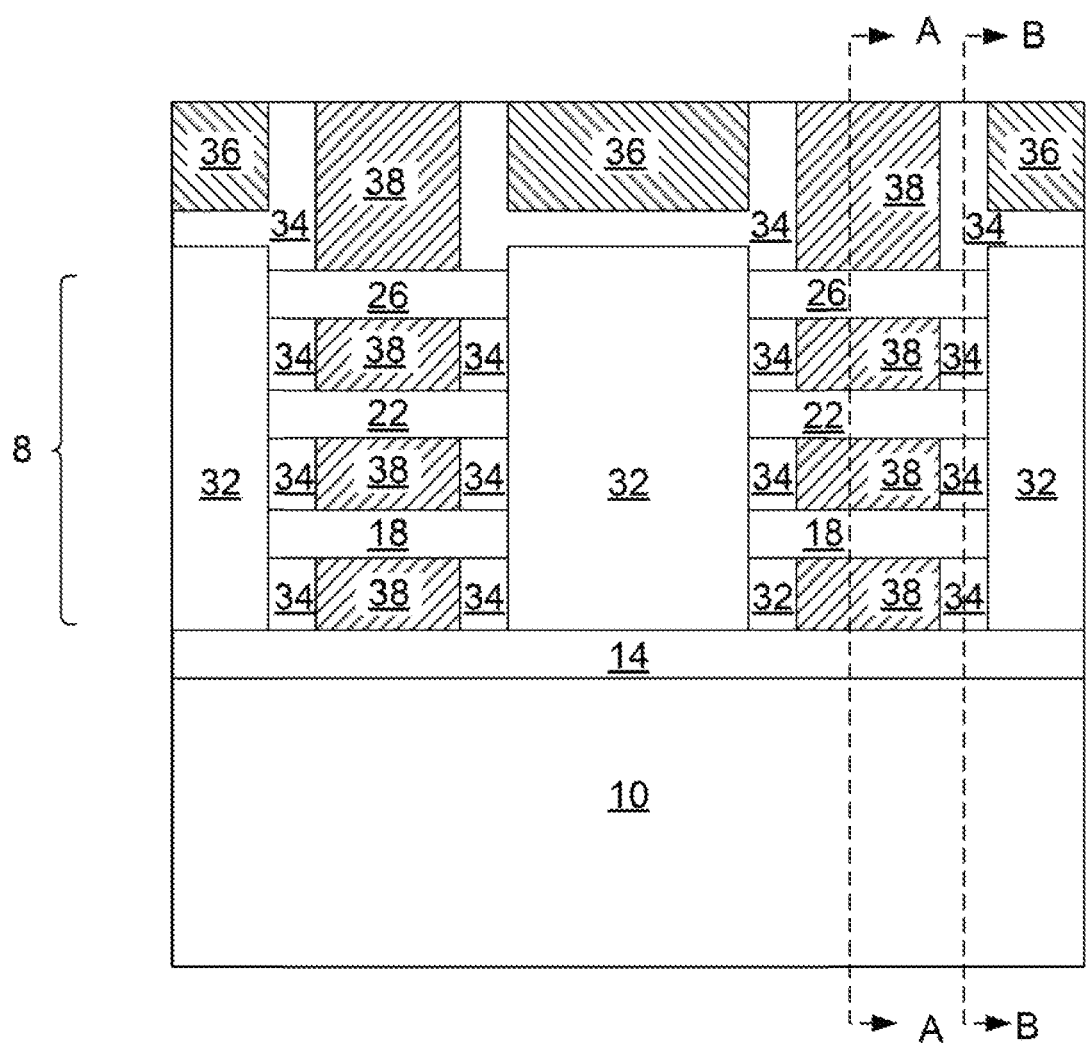
FIG. 23 illustrates a cross-sectional view of the semiconductor structure and illustrates a replacement gate process, according to an exemplary embodiment.
Figure 24:
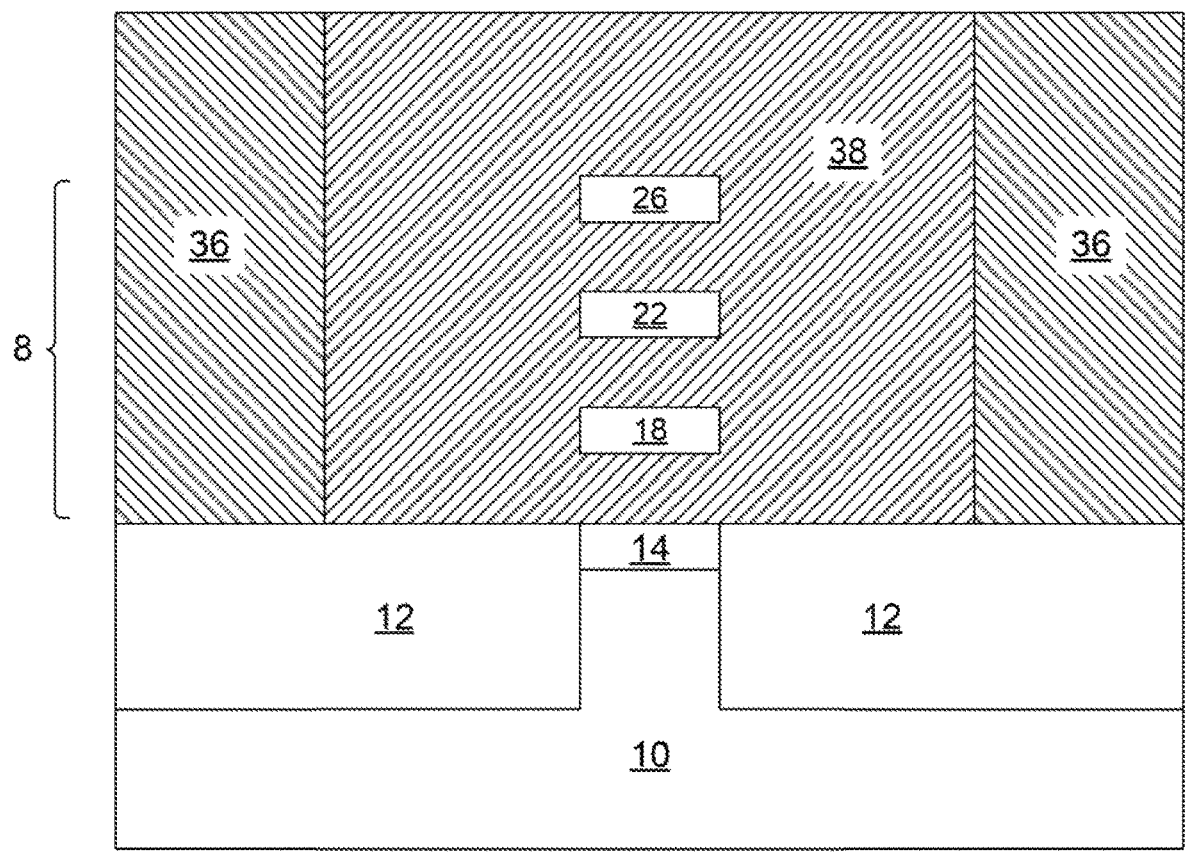
FIGS. 24 and 25 each illustrate a cross-sectional view of the semiconductor structure of FIG. 23 along sections A-A and B-B, respectively, according to an exemplary embodiment.
Figure 25:
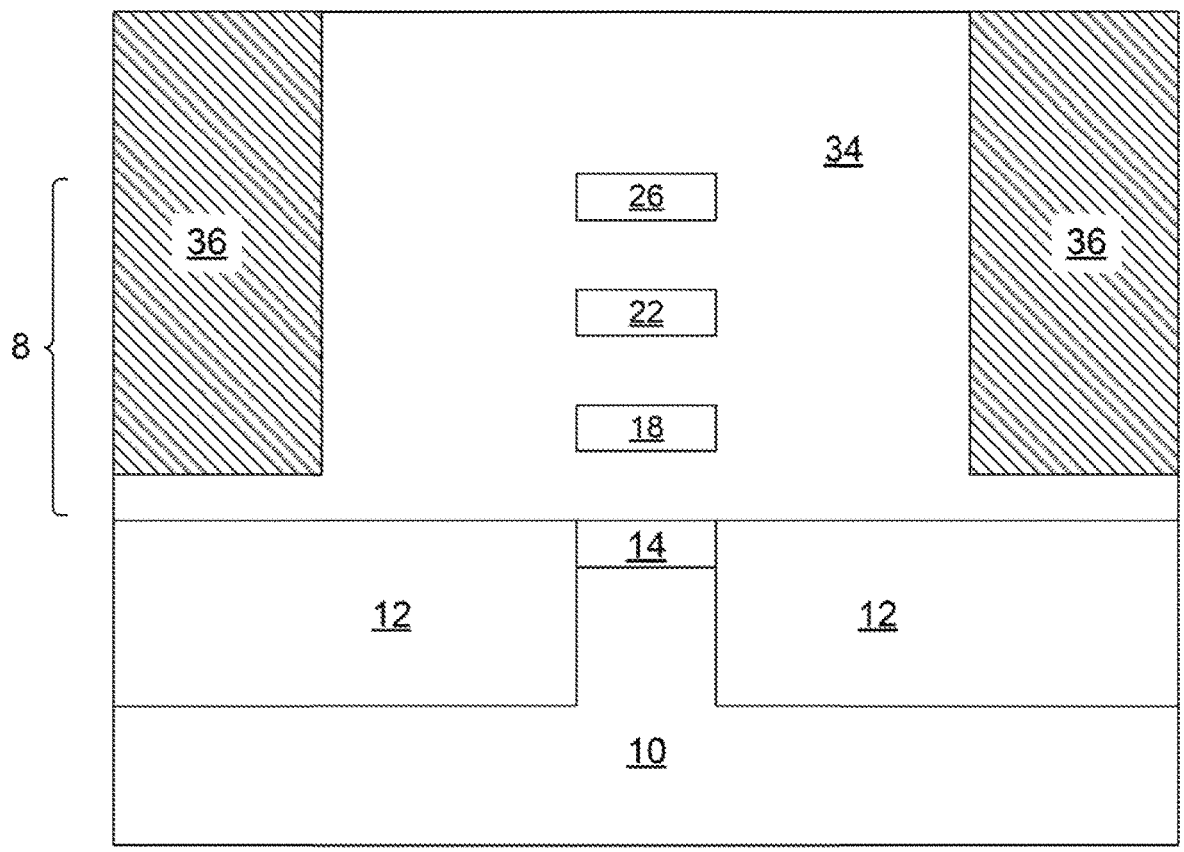

Referring now to FIGS. 23, 24 and 25, the structure 100 is shown according to an exemplary embodiment. FIG. 23 is a cross-sectional view of the structure 100 along a center line of the fin structure. FIG. 24 is a cross-sectional view of the structure 100 along section line A-A, illustrating a view perpendicular to a length of the fin structure. FIG. 25 is a cross-sectional view of the structure 100 along section line B-B, illustrating an additional view perpendicular to a length of the fin structure, and is parallel to the cross-sectional view of FIG. 24.

As shown in FIGS. 23, 24 and 25, several steps may be performed. An interlayer dielectric (hereinafter "ILD") 36 may be formed directly on exposed top surfaces of the structure 100, according to an exemplary embodiment. The ILD 36 may be formed by similar method as described above for the low-k spacer 34.

A portion of the structure 100 may be removed using a chemical mechanical polishing (CMP) technique until an upper surface of the dummy gate 28 is exposed.

The dummy gate 28 and the silicon layers, remaining portions of the $1^{st}$ SiGe layer 16, the $2^{nd}$ SiGe layer 20 and the $3^{rd}$ SiGe layer 24, may be selectively removed in one or more steps, as previously described regarding wet or dry etch processes.

A metal gate 38 may be conformally formed to complete the replacement gate process. A high-k liner (not shown) may first be formed prior to the deposition of the metal gate 38 and may be formed as previously described regarding the low-k spacer 34.

The high k liner may include materials such as HfO2, ZrO2, Al2O3, La2O3. The metal gate 38 may be formed in areas where the dummy gate 28 and the $1^{st}$ Si layer 18, the $2^{nd}$ Si layer 22 and the $3^{rd}$ Si layer 26 were previously removed. The metal gate 38 may have a vertical surface coplanar with a vertical surface of the low-k spacer 34.

The metal gate 38 may have a first lower horizontal surface coplanar with an upper horizontal surface of the dielectric 14 and a first upper horizontal surface coplanar with a lower horizontal surface of the $1^{st}$ silicon layer 18. The metal gate 38 may have a second lower horizontal surface coplanar with an upper horizontal surface of the $1^{st}$ silicon layer 18 and a second upper horizontal surface coplanar with a lower horizontal surface of the $2^{nd}$ silicon layer 22. The metal gate 38 may have a third lower horizontal surface coplanar with an upper horizontal surface of the $2^{nd}$ silicon layer 22 and a third upper horizontal surface coplanar with a lower horizontal surface of the $3^{rd}$ silicon layer 26.

The metal gate 38 may have a $2^{nd}$ vertical surface coplanar with a vertical surface of the ILD 36. The metal gate 38 may have a $3^{rd}$ vertical surface coplanar with a vertical surface of the low-k spacer 34.

The structure 100 provides for formation of a source drain epitaxy in a nanosheet FET device which is a strained nanowire transistor, where the growth of the source drain epitaxy is grown with a larger lattice constraint to introduce stress in the channel, by growing the source drain epitaxy from both the exposed edges of the silicon layers of the and from the exposed edges of the silicon germanium layers. The introduction of stress in the channel can boost transistor performed allowing a higher circuit speed and higher current than a nanosheet FET device with a source drain epitaxy grown from only exposed edges of the silicon layers of the nanosheet FET. The source drain epitaxy has an improved quality and coverage with a large epitaxy nucleation area, compared to source drain epitaxy grown from only exposed edges of the silicon layers of the nanosheet FET.

An additional advantage of the structure 100 is the same low-k spacer may be used for both an inner spacer and an outer spacer. Specifically, the low-k spacer 34 is used as an inner spacer within the nanostack, at an edge of the $1^{st}$ SiGe layer 16, the 2$^{nd}$ SiGe layer 20 and the 3$^{rd}$ SiGe layer 24, where each of the 3 SiGe layers are subsequently removed and filled with the metal gate 38, retaining the low-k spacer 34 as an inner spacer. Additionally, the low-k spacer 34 is an outer spacer above the nanostack, between the metal gate 38 and the ILD 36.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for forming a semiconductor structure, the method comprising:
    forming a fin, wherein the fin comprises a nanowire stack on a semiconductor substrate, wherein the nanowire stack comprises a plurality of silicon layers and a plurality of silicon germanium layers stacked one on top of the other in an alternating fashion;
    removing a portion of the fin to form a first opening and expose vertical sidewalls of the plurality of silicon layers and the plurality of silicon germanium layers;
    epitaxially growing a source drain region in the first opening directly from the exposed vertical sidewalls of both the plurality of silicon layers and the plurality of silicon germanium layers,
    wherein the source drain region substantially fills the first opening; and
    removing a portion of a first silicon germanium layer of the plurality of silicon germanium layers to form a second opening and expose a portion of a vertical side surface of the source drain region, a vertical side surface of a remaining portion of the first silicon germanium layer of the plurality of silicon germanium layers, and a portion of a lower horizontal surface of a first silicon layer of the plurality of silicon layers.

2. The method according to claim 1, further comprising:
    forming a dummy gate liner on a portion of the fin prior to forming the opening.

3. The method according to claim 2, further comprising:
    removing a portion of the dummy gate liner from a horizontal upper surface of the fin.

4. The method according to claim 3, further comprising:
    forming a dielectric on the semiconductor substrate prior to forming the fin.

5. The method according to claim 1, further comprising:
    depositing a low-k spacer in the second opening.

6. The method according to claim 1, further comprising:
    replacing the silicon germanium layers each with a high k layer.

7. A method for forming a semiconductor structure, the method comprising:
    forming an opening in a stacked nanowire fin formed on a substrate, wherein the stacked nanosheet fin comprises alternating layers of silicon germanium and silicon stacked one on top of the other;
    growing an epitaxy in the opening from each of the silicon germanium layers and each of the silicon layers;
    forming a dummy gate liner on exposed surfaces of the semiconductor structure prior to forming the opening;
    removing a portion of the dummy gate liner from a horizontal upper surface of a dummy gate; and
    selectively removing a remaining portion of the dummy gate liner.

8. The method according to claim 7, further comprising:
    forming a second opening by selectively removing a portion of the each silicon germanium layers, wherein a vertical side surface of the second opening is coplanar with a vertical side surface of the epitaxy, a second vertical side surface of the second opening is coplanar with a vertical side surface of a remaining portion of each silicon germanium layer, a lower horizontal surface of the second opening is coplanar with an upper horizontal surface of a dielectric layer, and an upper horizontal surface of the second opening is coplanar with a lower horizontal surface of each silicon layer.

9. The method according to claim 8, further comprising:
    depositing a low-k spacer in the second opening.

10. The method according to claim 7, further comprising:
    replacing the silicon germanium layers with a high k layer.

11. A semiconductor structure comprising:
    a nanowire fin stack on a semiconductor substrate, the nanowire fin stack comprises nanowire channels one on top of another;
    a metal gate on and perpendicular to the nanowire fin stack, the metal gate surrounds the nanowire channels;
    epitaxial source drain regions on an upper surface of the semiconductor substrate, the epitaxial source drain regions directly contacting ends of the nanowire channels; and
    a spacer layer separating the metal gate from the epitaxial source drain regions, opposite sidewalls of the metal gate are in direct contact with and entirely covered by the spacer layer, upper surfaces of the epitaxial source drain regions are completely covered by the spacer layer.

12. The semiconductor structure according to claim 11, further comprising:
    wherein a horizontal lower surface of the epitaxial source drain regions are each coplanar with an upper horizontal surface of a dielectric layer below the nanowire fin stack.

13. The semiconductor structure according to claim 12, wherein the spacer layer extends from the nanowire fin stack to an adjacent nanowire fin stack.

14. The semiconductor structure according to claim 11, further comprising:
    a shallow trench isolation region in the semiconductor substrate adjacent to the nanowire fin stack.

15. The semiconductor structure according to claim 11, further comprising:
    a dummy gate liner on exposed surfaces of the semiconductor structure.

16. The semiconductor structure according to claim 11, further comprising:
    source drain contacts connected to the epitaxial source drain regions.

* * * * *